(12) United States Patent
Siprak et al.

(10) Patent No.: US 8,149,046 B2
(45) Date of Patent: Apr. 3, 2012

(54) BIASING FOR TRANSISTOR-BASED APPARATUSES AND METHODS

(75) Inventors: Domagoj Siprak, Munich (DE); Marc Tiebout, Finkenstein (AT); Stephan Henzler, Taufkirchen (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/388,412

(22) Filed: Feb. 18, 2009

(65) Prior Publication Data

US 2010/0066435 A1 Mar. 18, 2010

Related U.S. Application Data

(60) Provisional application No. 61/096,702, filed on Sep. 12, 2008.

(51) Int. Cl.
*H03K 3/01* (2006.01)
(52) U.S. Cl. ........................................ 327/534; 327/427
(58) Field of Classification Search .................. 327/427, 327/434, 534
See application file for complete search history.

(56) References Cited

U.S. PATENT DOCUMENTS

| | | | |
|---|---|---|---|
| 3,866,064 A | 2/1975 | Gregory et al. | |
| 5,748,029 A | 5/1998 | Tomasini et al. | |
| 5,933,026 A | 8/1999 | Larsen et al. | |
| 6,124,747 A * | 9/2000 | Nasu | 327/281 |
| 6,184,729 B1 * | 2/2001 | Pasqualini | 327/112 |
| 6,225,852 B1 | 5/2001 | Cleveland et al. | |
| 6,404,243 B1 * | 6/2002 | Koch et al. | 327/107 |
| 6,999,747 B2 * | 2/2006 | Su | 455/324 |
| 7,123,076 B2 | 10/2006 | Hatakeyama et al. | |
| 7,164,291 B2 * | 1/2007 | Mair et al. | 326/83 |
| 7,489,189 B2 * | 2/2009 | Lee | 330/10 |
| 2004/0129969 A1 | 7/2004 | Colombo et al. | |
| 2004/0259519 A1 | 12/2004 | Su | |
| 2006/0066462 A1 * | 3/2006 | Paillet et al. | 341/143 |
| 2006/0223201 A1 | 10/2006 | Liu et al. | |
| 2007/0046386 A1 | 3/2007 | Yu | |
| 2007/0133137 A1 | 6/2007 | Dornbusch | |
| 2007/0171081 A1 | 7/2007 | Dixon et al. | |
| 2008/0094112 A1 * | 4/2008 | Tanaka | 327/108 |
| 2008/0135953 A1 | 6/2008 | Siprak | |
| 2009/0179695 A1 | 7/2009 | Siprak et al. | |
| 2010/0066430 A1 | 3/2010 | Siprak et al. | |

FOREIGN PATENT DOCUMENTS

DE 4131783(C1) 2/1993
EP 2079162 7/2009

OTHER PUBLICATIONS

Office Action dated Jun. 15, 2011 from corresponding German patent application 10 2009 041 211.5, 6 pages.
Final Office Action for U.S. Appl. No. 12/388,407, mailed on Jul. 8, 2011, Domagoj Siprak, "Controlling a Flicker Noise Characteristic Based on a Dielectric Thickness".

* cited by examiner

*Primary Examiner* — Quan Tra
(74) *Attorney, Agent, or Firm* — Eschweiler & Associates, LLC

(57) ABSTRACT

The present disclosure relates to constructing and operating a transistor or other active device with significantly reduced flicker noise.

17 Claims, 36 Drawing Sheets

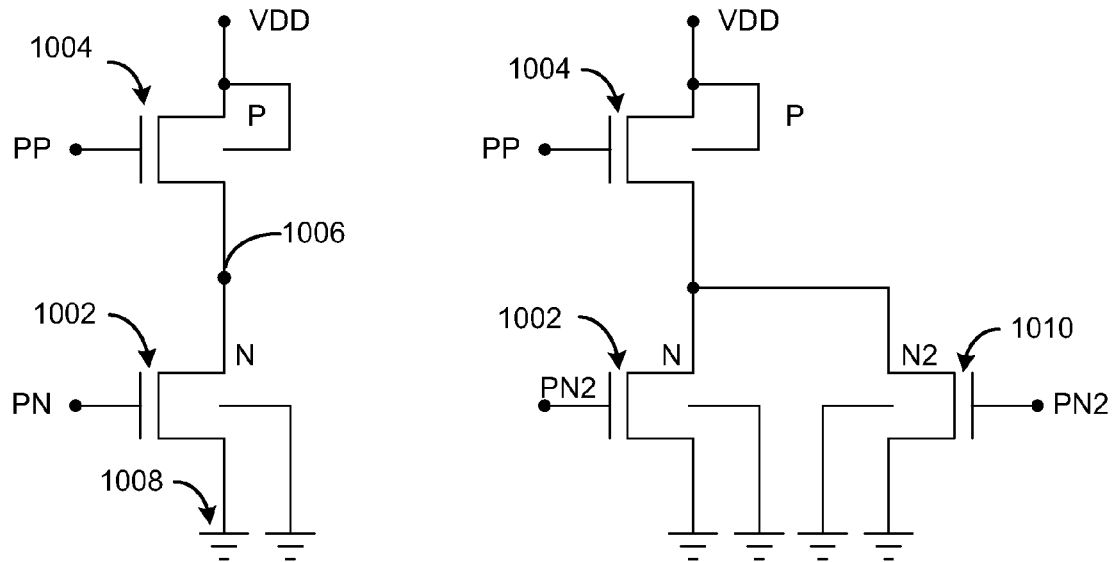
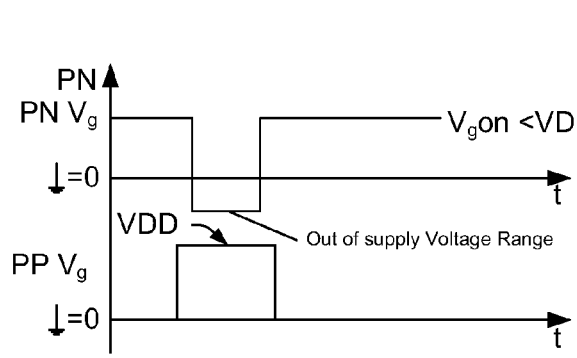
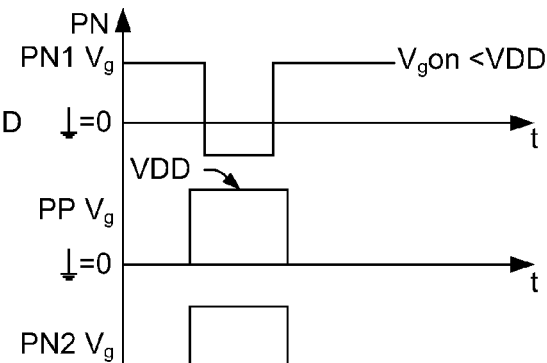
FIG. 10a
FIG. 10b

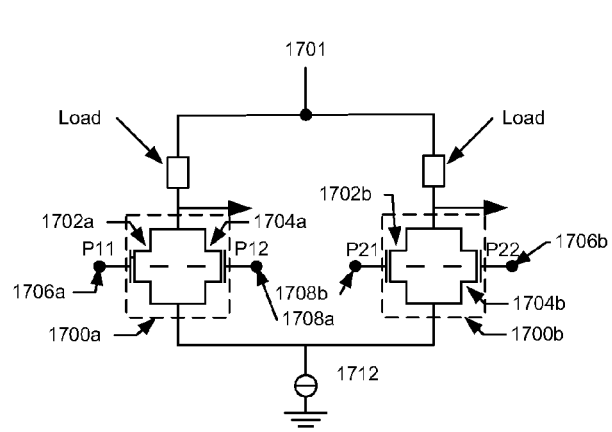
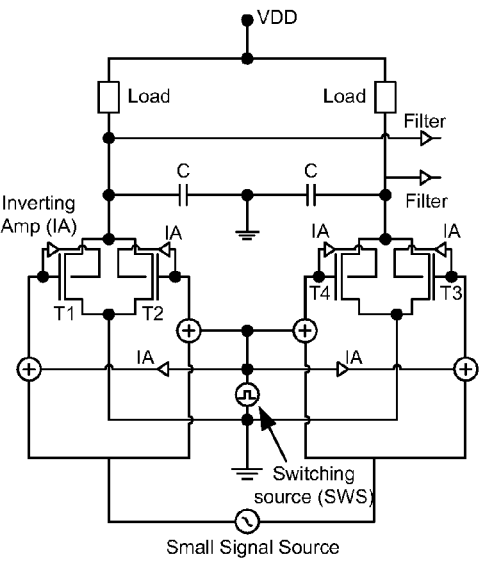
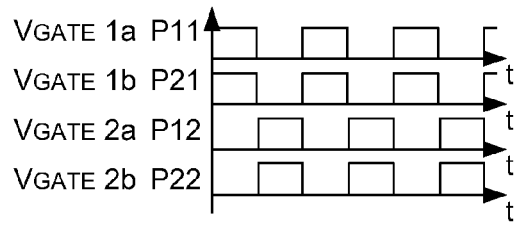
FIG. 17a
FIG. 17b
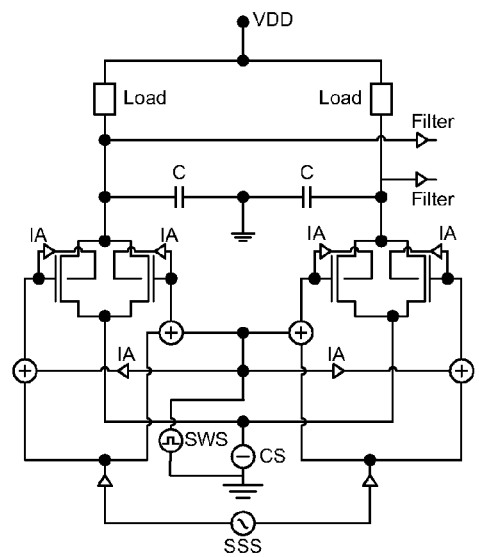
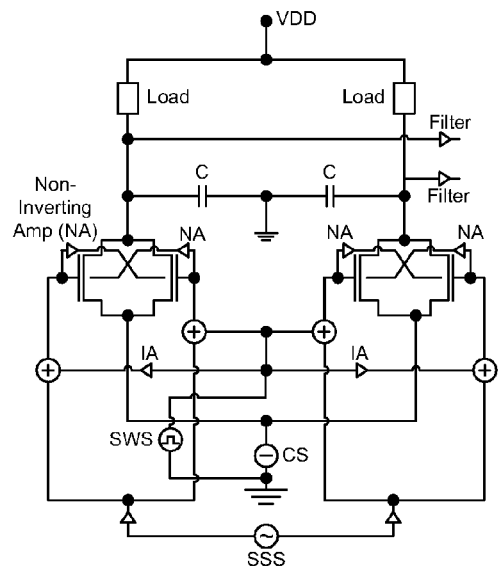
FIG. 17c
FIG. 17d

BIASING FOR TRANSISTOR-BASED APPARATUSES AND METHODS

RELATED APPLICATIONS

This application claims the benefit under 35 USC 119(e) to U.S. Provisional Application Ser. No. 61/096,702 filed on Sep. 12, 2008 entitled "Reduced Noise in a transistor" by first named inventor Domagoj Siprak.

BACKGROUND

In electronic signal processing, it is usually required to process a signal having low or high signal amplitude. The processing of a signal having low signal amplitude is limited by a noise spectrum. Noise is attributable to diverse sources, including external sources as well as sources caused by effects intrinsic to an apparatus performing the signal processing. One particular noise term in semiconductor devices is so-called "flicker noise", that is also known as "1/f-noise". A low-frequency noise source closely related to flicker noise is so-called "random telegraph" signals. In the following disclosure, the term "flicker noise" is used for low-frequency noise like 1/f-noise or noise due to random telegraph signals.

As indicated by its later denotation, 1/f-noise is most problematic in a low frequency spectral region. Additionally, flicker noise deteriorates the performance of non-linear circuits, e.g. having low frequency flicker noise being mixed and/or translated to higher frequencies in devices, such as frequency mixers, and voltage controlled oscillators. Mitigation of flicker-noise, so as to improve signal-to-noise performance within transistors and active devices, is desirable in the electrical engineering arts.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIG. 10a shows an example of applying to a transistor an out of supply voltage range signal PN $V_g$. FIG. 10b shows an alternative implementation of applying to a transistor an out of supply voltage range signal PN $V_g$.

FIG. 17 is a schematic diagram and timing diagram for operating a differential amplifier utilizing two switching pairs.

DETAILED DESCRIPTION

Figure 1:
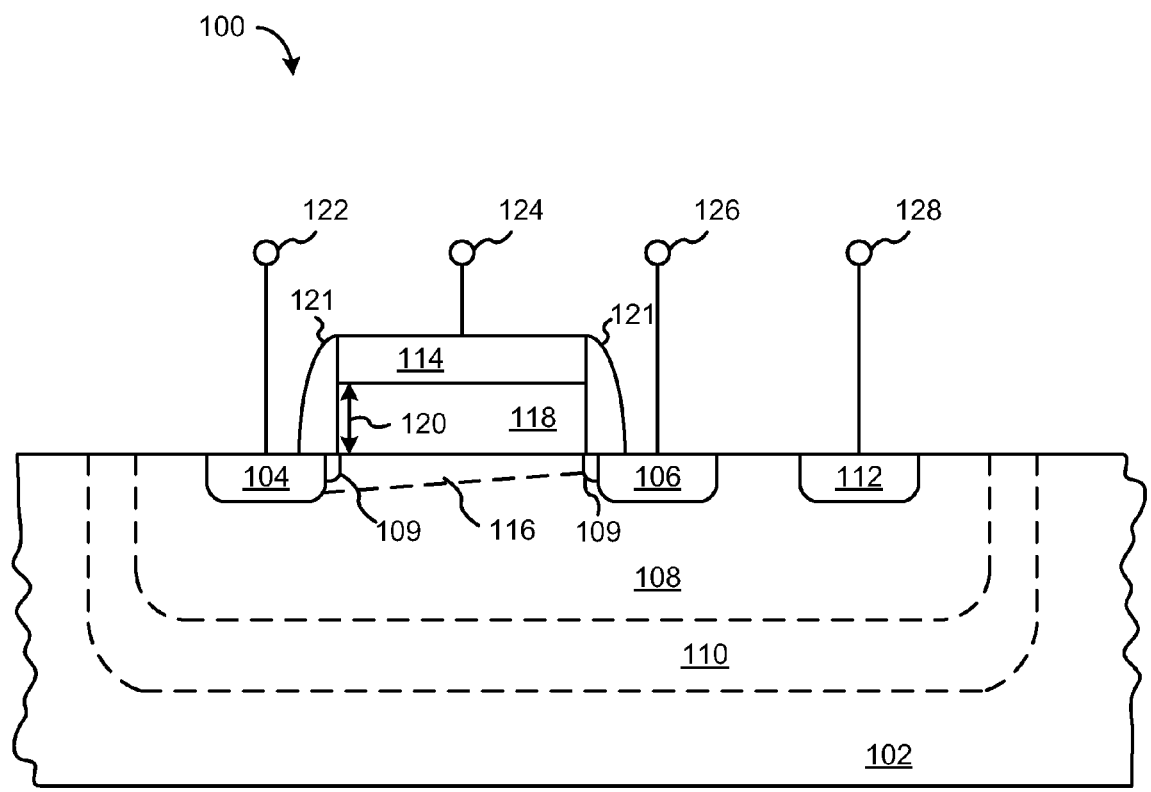
FIG. 1 is a diagrammatic view depicting a transistor formed within a semiconductor body.

Disclosed herein are improved techniques for reduced flicker noise that are applicable, for example, to semiconductor devices. Techniques in accordance with the present disclosure may advantageously improve performance and reliability of such devices by improving noise behavior and reducing current consumption. In general, techniques for signal processing having a reduced flicker noise as taught by the present disclosure may use an active device having an optimized dielectric material, and receiving a switched bias (gate to source voltage) signal and a forward body-bias (e.g. substrate to source, substrate to gate, etc.) signal.

According to one implementation, an apparatus includes an active device structured in a semiconductor body. The active device includes a control terminal to receive a bias signal, and a dielectric material. The dielectric material is defined by a thickness and a relative dielectric constant selected such that a flicker noise characteristic of the active device is reduced below a threshold level, such as when operated with a body bias technique as described herein. The active device also includes a bulk terminal to receive a body-bias signal. The apparatus also includes a first circuit portion coupled to the control terminal to provide a switched bias signal. The apparatus further includes a second circuit portion coupled to the bulk terminal to provide a forward body-bias signal.

According to another implementation, a transistor includes a semiconductor body and a gate. The transistor further includes a dielectric material separating the gate from the semiconductor body. The dielectric material is defined by an overall thickness and an overall relative dielectric constant selected such that the transistor performs with a flicker noise characteristic below a threshold level during body-biased operation of the transistor or when the gate receives an out of supply voltage range signal.

According to still another implementation, an apparatus includes a source of electrical energy, and a circuit coupled to the source of electrical energy. The circuit includes a transistor having a dielectric material. The dielectric material is defined by an overall thickness and an overall relative dielectric constant selected such that the transistor performs with a flicker noise characteristic below a threshold level during body-biased operation of the transistor or when the gate receives and out of supply voltage range signal.

In yet another implementation, a method of forming an active device includes providing a substrate material, and forming at least one well region in the substrate. The method also includes forming a source region and a drain region in the at least one well region. The method further includes forming a dielectric material over the at least one well region. The dielectric material is defined by an overall thickness and an overall relative dielectric constant selected such that the active device performs with a flicker noise characteristic below a threshold level during body-biased operation. The method also includes forming a gate region over at least a portion of the at least one well region, wherein the dielectric material separates the gate region from the at least one well region.

Circuits and functional aspects provided herein can be fabricated, at least in part, on a common substrate such that one or more respective integrated circuit devices are defined. In one or more implementations, at least a portion of the functional subject matter presented herein can be fabricated within a 250, 180, 130, 90, 65, 45, or 32 nanometer (or smaller) environment.

The techniques described herein may be implemented in a number of ways. Illustrative context is provided below with reference to the included figures and ongoing discussion.

Definition of Terms

With reference to a metal-oxide semiconductor (MOS) transistor, the term "switched bias signal" may generally refer to a switched voltage between gate and source (i.e., $V_{gs}$) terminals of the transistor. The voltage switches between a first voltage and a second voltage. The first voltage is equal or larger than a transistor threshold voltage, thus driving the transistor into a state of inversion (i.e., electrically conductive, or "on-state") with a gate-to-source-voltage. The second voltage is below the threshold voltage, the transistor thus reaching the state of weak inversion, depletion, or accumulation (i.e., non-conductive, or "off-state").

The terms "forward body-bias signal" and "body-bias signal" generally refer to a voltage between a substrate, body, or bulk of the transistor, and the gate terminal of the transistor such that the device is driven toward strong accumulation. For example, in an NMOS transistor the bulk is biased to the positive supply voltage while the gate is biased to zero volts. The voltage may also drive a substrate-to-source-diode section of the transistor in forward direction. The potential of the substrate could thus be higher than the potential of the source, but not necessarily so. The substrate and the source can also be arranged for the same bias in so much as the bulk potential is more positive than the gate. The effect can be established for an N-type (e.g., NMOS) transistor by pulsing the gate to a lower voltage and the bulk to a higher voltage. The source potential needs only to be arranged such that the gate-to-source potential is below the threshold voltage for channel inversion. It is noted that the operation of an N-type transistor in its "on" state may avoid a forward body bias due to the degradation of the transconductance (gm) per current ratio.

The terms "gate-oxide" or "gate dielectric" refer to any material stack containing dielectric materials that separate a metal gate electrode from the underlying semiconductor substrate. The dielectric material may be based on silicon dioxide, which may be doped or undoped. It may as well be based on a high-k material having a higher dielectric constant, like $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{-x}O_y$, $Hf_xSi_{1-x}O_y$, HfSiON, HfZrOx, $Al_xZr_{1-x}O_2$, nitrided silicon dioxide, a stack of oxide nitride oxide, or silicon nitride $Si_3N_4$, etc. Such high-k dielectric may be composed of two or more layers with different dielectric constants and thicknesses. In this case, the term "gate dielectric thickness" refers to the physical thickness of the complete dielectric stack (regardless of number of material layers), and the term "dielectric constant" refers to the average relative dielectric constant of the complete stack.

The electrical thickness $t_{el}$ is derived from the physical thickness $t_{ox}$ and the average dielectric constant $e_r$ by the equation: $t_{el}=t_{ox}/e_r$. This leads to a gate dielectric specific area capacitance: $c=e_0/t_{el}$, wherein $e_0$ is the dielectric constant of the vacuum. Thus, an increase in thickness $t_{el}$ is equivalent to an increase in the physical dielectric thickness $t_{ox}$ (measureable, for example, by a transmission electron microscope) or a reduction of the average dielectric constant $e_r$.

According to one implementation, the term "threshold level" with respect to a flicker noise characteristic may be defined as the noise level reached for a transistor with minimum thickness of the gate dielectric for a given set of operating conditions, e.g. without a body bias signal applied to the transistor, or with an out of supply voltage range switching voltage applied to a transistor, for a given gate length and gate width. Thus, a threshold level for the flicker noise characteristic may be selected to be a value at or lower than the value of a flicker noise characteristic for a transistor of a given gate length and gate width that has a particular gate dielectric thickness and relative dielectric constant to yield a maximum output drain current or transconductance.

The term "gate" refers to any electrode material or material stack forming a gate as, for example, doped poly silicon or TiN, TaN, aluminum, or any other metal gates used in high-k metal gate devices (HKMG).

The term "trap" denotes material defects that are able to capture mobile charge from a conducting inversion channel of a MOS transistor or emit charge to a inversion layer and by that changing the charge density and, in some instances, mobility in a channel region and so the device current.

The term "asynchronous" used in this document may be used to denote two signals that are not correlated to each other.

Illustrative Active Device

FIG. 1 shows an implementation of a transistor (or active device) 100 formed in a semiconductor body. The active device is a field effect transistor 100 formed in a substrate 102 made of a semiconductor material, such as Silicon or Gallium-Arsenide. It is readily understood by one skilled in the art, that any other suitable semiconductor material may be used accordingly. The substrate 102 may be, for example, p-doped, so as to form a field effect transistor of the n-type. The active device has a source region 104 being an n-doped region. It further has a drain region 106 being an n-doped region. The source region 104 and the drain region 106 are arranged within a p-well 108 formed in the substrate 102 and may have associated lightly doped regions 109. The p-well 108 is embedded in an n-well 110, so to isolate the p-well 108 from the remaining substrate 102. A body contact region 112, being a p-doped region, is arranged in the p-well 108. A gate region 114 is formed at least partly over a channel region 116 between the source region 104 and the drain region 106.

A gate-oxide (i.e., dielectric material) 118 separates the gate region 114 and the channel region 116 (i.e., as well as the substrate 102) and dielectric spacers 121 may be formed at the along the gate region 114 and dielectric material 118. The dielectric material 118 is defined by a thickness 120. The thickness 120 of the dielectric material 118 is selected so that a flicker noise characteristic of the transistor 100 is reduced below a threshold level. The threshold level of the flicker noise characteristic under body bias or out of supply voltage switching conditions described herein may be defined based upon, for example, the noise or signal to noise ratio characteristic of a transistor with a conventional gate dielectric thickness under normal conditions (e.g., not under switched body bias or out of supply voltage range switching conditions), and may be a signal-to-noise ratio expressed as a factor, a decibel value, and so on. The dielectric material 118 and its selected thickness 120 are discussed in further detail below.

A drain terminal 126 connects to the drain region 106. A gate terminal 124 connects to the gate region 114. A source terminal 122 connects to the source region 104. A bulk terminal 128 connects to the body contact region 112. The exemplary active device 100 thus constitutes a MOSFET transistor of the n-type. However, the transistor 100 is non-limiting and the present disclosure also contemplates application of the described techniques to any other transistor, such as a FET transistor of the p-type, a bulk FinFET, a bulk multigate FET (MuGFET), or other suitable device.

Illustrative Schematic Symbol

Figure 2:
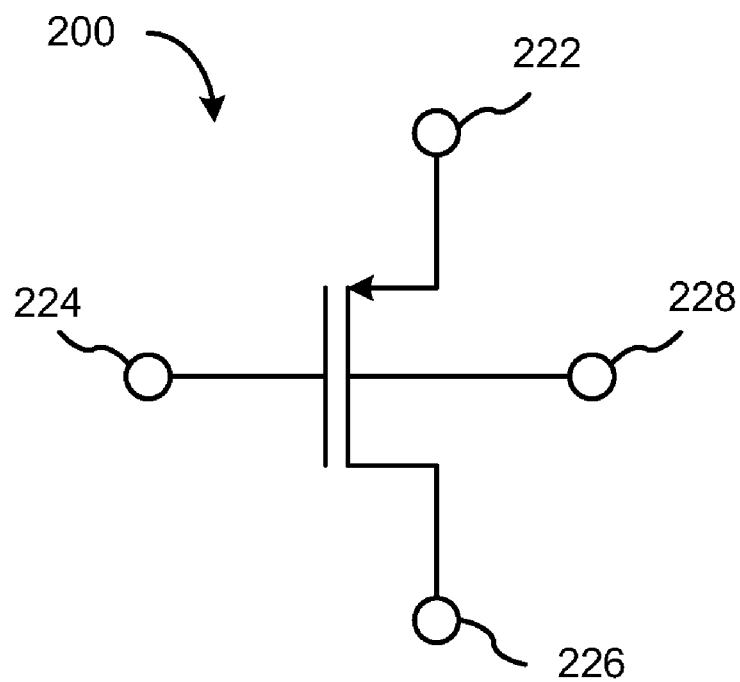
FIG. 2 is a schematic symbol depicting a transistor according to the present teachings.

FIG. 2 shows a circuit representation 200 of the active device (e.g., MOS (metal oxide semiconductor) or MIS (metal insulator semiconductor) transistor) 100 of FIG. 1. The active device 200 has a drain terminal 222, a gate terminal 224, a source terminal 226, and a bulk terminal 228.

Illustrative Body-Biasing Characteristics

Figure 3:
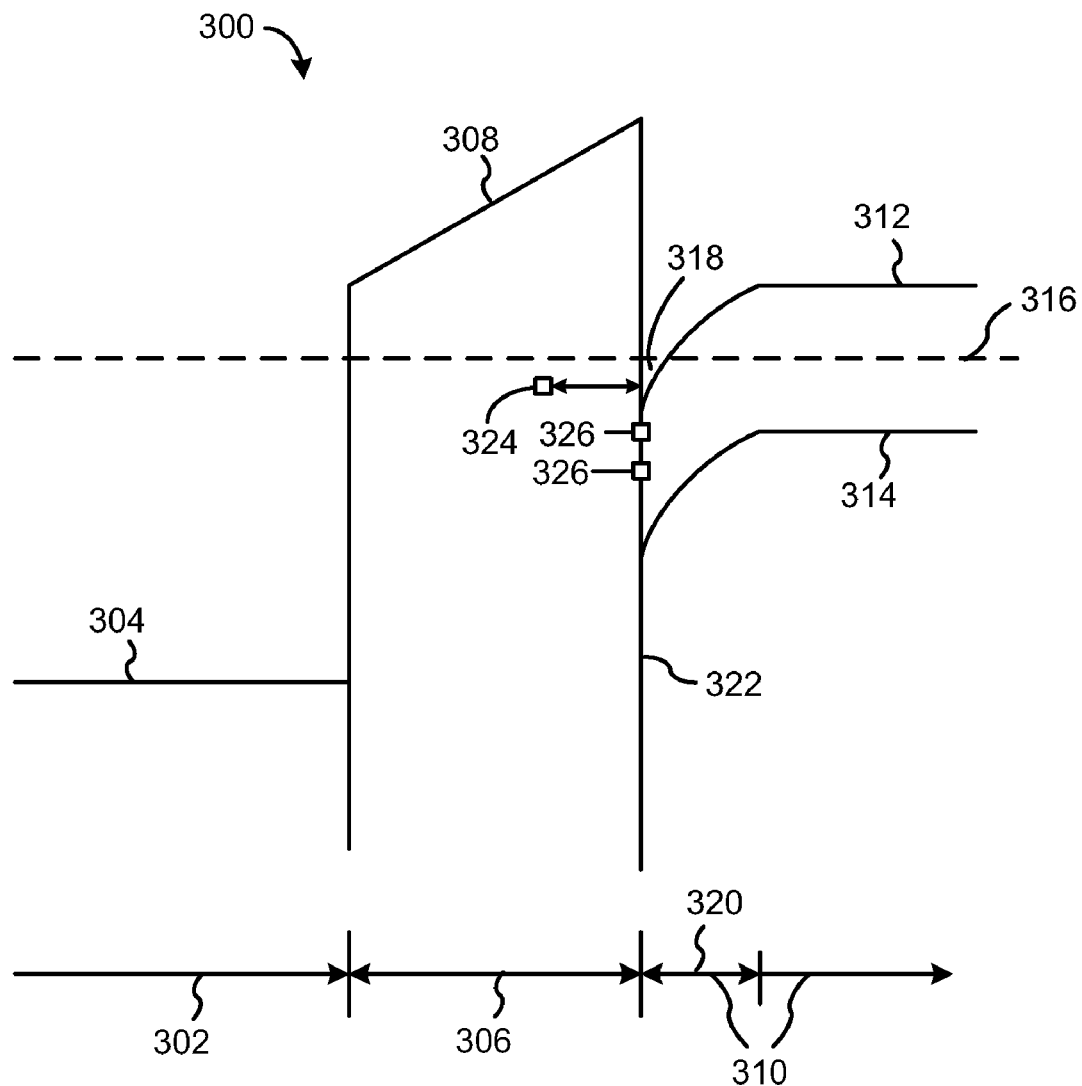
FIG. 3 is an energy-band diagram corresponding to the transistor of FIG. 1 operating in an electrically conductive state.

FIG. 3 shows a schematic representation of an energy-band (band) diagram 300 for the active device (transistor 100) according to FIG. 1 in inversion (i.e., conductive state). The functioning of a MOSFET is based upon drift transport of minority carriers within the channel region 116. Therein, control of the conductivity of channel region 116 is mainly performed by influencing the carrier density. Thus, an electric potential applied to the gate region 114 controls the conductivity property of the channel region 116. A voltage supplied at the gate terminal 124 with reference to the gate to source (or gate to substrate, or gate to body) potential defines the electric potential.

The band diagram 300 shows the energy levels in three regions of the transistor 100. The first region 302 corresponds to the gate region 114. A first energy level 304 shows the Fermi level of the metal gate 114.

A second region 306 corresponds to the dielectric 118. The dielectric (e.g., gate-oxide) 118 has a thickness 120 that is also designated herein as ($t_{ox}$) and a relative dielectric constant $e_r$. A second energy level 308 shows the energy distribution in the dielectric 118, having a constant dielectric constant, when a voltage $V_{gb}$ is applied between gate terminal 124 and the p-well 108, or respectively a voltage $V_{gs}$ between the gate terminal 124 and the source terminal 122. The dielectric may alternatively have a graded dielectric, i.e. a single or multi layer gate dielectric, with each layer potentially having a different dielectric constant, for example, a higher dielectric constant at the gate electrode and a lower dielectric constant at the semiconductor interface, or vice versa. Such a graded dielectric could be represented by a curved or changing slope energy level 308. The second energy level 308 has an ascending slope of $e \cdot V_{gs}/t_{ox}$ within the second region 306. The constant "e" represents the elementary charge of an electron.

A third region 310 corresponds to the p-well 108. A third energy level 312 corresponds to the conductance band of the p-well 108. A fourth energy level 314 corresponds to a valence band of the p-well 108. A fifth energy level 316 corresponds to the Fermi level for electrons in the p-well 108. The first energy level 304 and the fifth energy level 316 are spaced apart by an energy level of e·$V_{gs}$. The voltage $V_{gs}$ represents the gate-source voltage applied to the active device 100. Due to a positive value of $V_{gs}$, the band bending of the conduction band is high enough to accumulate negative surface charge in an inversion layer 318 of the depletion zone 320 of the third region 310. The depletion zone 320 has a thickness dS that depends on the doping concentration of p-well 108. The negative surface charge in the inversion layer 318 forms the channel 116 of the active device (transistor) 100. A transport of carriers takes place in the channel 116.

Traps in the dielectric 118 and/or at the interface 322 between the dielectric 118 and the p-well 108 result in the capture of mobile carriers from the channel 116 and emission of captured charge into the channel 116. By way of non-limiting example, a charge trap 324 is shown in FIG. 3. The charge trap 324 is located at an energy level similar to the energy level of the inversion layer 318 or below. Carriers of the inversion layer 318 (i.e., the channel region 116) may be trapped by the charge trap 324. Traps in the dielectric 118 with an energy level in the band gap between conduction band 312 and valence band 314 communicate with the conduction band 312 and the valance band 314 via so-called interface traps 326 residing at the interface between the dielectric 118 and the p-well 108. The charging and de-charging rate of the charge trap 324 may depend on various factors, such as: (A) capture cross section of the charge trap 324; (B) emission cross sections of the charge trap 324 influenced by the density of states of the band structure where captured charge wants to tunnel to; (C) energy of the charge trap 324 with respect to the Fermi level 316; and (D) distance of charge trap 324 to the interface 322.

Trapped charges will also influence charge in the channel region 116 by changing channel charge density via the potential influence of the trapped charge and mobility by acting as a scattering center for mobile channel charge. Both effects lead to a change in current of the transistor 100. The influence depends on the distance of the charge trap 324 to the interface 322.

Flicker noise in a semiconductor device is caused by charging and de-charging the charge trap 324, which leads to fluctuations in the drain current of the transistor 100. The oscillation of carriers between the charge trap 324 and the inversion layer 318 gives rise to noise in signals transmitted via the channel region 116. Since the oscillation is at a relative low rate, the noise is most dominant at low frequencies, although it is noticeable up to frequencies around 100 MHz. With scaling of transistor structures, flicker noise will become noticeable at even higher frequencies.

Flicker noise deteriorates the performance of active devices in analog and/or radio frequency systems. The effect becomes even more important, since modern technologies, having nitrided gate-oxides or high-k gate dielectrics (e.g., 118), showing higher flicker noise compared to pure silicon dioxide. Technology scaling towards smaller semiconductor devices increases local statistical mismatch variations of flicker noise. Reduced gate length of scaled technologies further increases flicker noise.

The techniques described in the present disclosure make use of the finding that flicker noise may be significantly reduced by a combination of a switched bias condition and a positive back-biasing (i.e., applying a forward body-bias signal to the p-well 108). Applying a switched bias condition shifts the energy level of the charge trap 324 and the bands at the dielectric-to-p-well interface 322 where trapped charge may tunnel to, alternating below and above the Fermi level. Together with the bands, the energy levels of the interface traps 326 are also shifted. Energy levels above the Fermi level 316 for electrons are empty and below are filled (within a certain energy distribution width for clear empty to clear filled state). Changing the gate voltage to a negative potential with respect to the p-well 108 accumulates a high concentration of holes and empties interfaces states. The positive p-well 108 forward body back-biasing signal establishes this potential for a gate to source voltage ($V_{gs}$) of zero volts. The value of the source potential needs only to be arranged such that the gate-to-source voltage is below the threshold voltage for channel inversion.

Interface states communicate very fast with the valance band 314 and conduction band 312. Thus, during the transistor off state the positive p-well forward body back-bias signal establishes a situation that strongly reduces the trap emission time for emptying a charged trap 324. The charge trapped in the charge trap 324 may be emptied by tunneling to the conduction band 312 and recombine via interface traps 326 with the accumulated holes in the valence band 314, or by tunneling directly to an interface trap 326 at the same energy level and recombining with the accumulated holes in the valence band 314. Switching the gate bias signal below the threshold voltage for a certain time while having a forward body-bias strongly increases, during this time, the rate of emptying the charge trap 324. The effective emission time $t_{eff}$ is the result of the emission time ton during the on time $T_{on}$ and the emission times $t_{off}$ during the off state time $T_{off}$ according to the equation: $1/t_{eff} = T_{on}/T * 1/t_{on} + T_{off}/T * 1/t_{off}$, wherein $T = T_{on} + T_{off}$. If the off emission time is reduced strongly, then the effective emission time is reduced accordingly. A charge trap 324 filled by a slow (long) capture time and emptied by a fast (short) emission time produces a low noise power density. As a result, the main cause of flicker noise is significantly suppressed.

It had been further recognized by the inventors that the application of a forward body-bias only results in a significant reduction in flicker noise if the forward body-bias is applied during the time when the active device (e.g., transistor 100) is driven into its "off" (i.e., non-conductive) state. Furthermore, due to the described mechanism, it may be advantageous to apply the forward body-bias only when the transistor is in its "off" state. A forward body-bias may degrade the ratio of transconductance (gm) to current (e.g., gm/Id). Thus, it is preferable to have no forward body-bias during the "on" (i.e., conductive) state of the transistor and applying the forward body bias only during the "off" state of the transistor. To that end, the forward body-bias may be a switched signal that is 180° out of phase with the switched bias (i.e., gate control) signal. It may be derived from the inverse switched bias signal. The use of a switched forward body-bias may reduce power consumption and area of the active device.

The described techniques work for high frequency signals of switched gate bias and switched forward body-bias as well, because for a signal with 50% duty cycle, the transistor sees 50% of the time a situation wherein there is a much shorter emptying time then during the other portion of the cycle. The effective emission time results from having 50% of the time a short emission time, and in the other 50% of the time a longer emission time. The overall result is a reduced emission time compared to constant or non-switched bias conditions. The duty cycle may not be 50% and the transistor may be in the "off" state for a shorter or longer percentage duration which, in combination with a forward body-bias, still results in significant noise reduction. The duty cycle leading to preferable or optimum noise reduction is determined by the emission time constants of the trap (e.g., 324) in the "off" and in the "on" state of the transistor 100.

However, noise reduction will only occur for frequencies below the switching frequency in case of a 50% duty cycle, and for other respective frequencies for a non-50% duty cycle. Duty cycles with less than 50% of "off" state may have advantages when a higher average DC transistor current with lower noise wants to be achieved. The short time "off" state pulses could be filtered more easily. Noise reduction may also be achieved with much lower frequency switching than the actual circuit is operating. For example, in the case of oscillator phase noise, the switching could be comparatively low with respect to the oscillation frequency because flicker noise, as a low-frequency phenomenon, may change the frequency of the oscillator only in a long time scale compared to the period of the oscillator.

The described techniques using a forward body-bias (i.e. a forward substrate bias) is an appropriate means for noise reduction in semiconductor circuits using scaled technologies. In particular, the fact that forward substrate bias is needed only during the transistor "off" state supports new circuit architectures and biasing schemes in circuits that may allow for different useful application of the described techniques.

Illustrative Dielectric Thickness Implementation

The inventors have further discovered that the thickness 120 of the dielectric material 118 has a substantial effect on reducing flicker noise during forward body-biasing operations according to the present teachings. The general relationship is that a thicker dielectric (i.e., gate oxide) layer results in an increased sensitivity of the flicker noise with respect to the amplitude of the gate "off" (control) signal and body bias signal. The thicker gate dielectric may be achieved by having a thicker physical thickness of the gate dielectric $t_{ox}$, or a gate dielectric with a lower average relative dielectric constant $e_r$, leading to a thicker electrical thickness $t_{el}=t_{ox}/e_r$.

As an illustrative and non-limiting example, a first transistor (e.g., transistor 100) was implemented in a 130 nanometer (nm) environment having a dielectric thickness of 2.2 nm, and considered under a first operating condition having no body-biasing whatsoever, and then under a second operating condition wherein body-biasing was applied. It was discovered that flicker noise was reduced by about a factor of two (approximately 3.0 dB differential) in the second operating condition relative to the first operating condition.

Thereafter, a second transistor was implemented in a 130 nm environment having the same overall characteristics as described immediately above, with the exception of having a 5.2 nm dielectric (i.e., gate oxide) thickness. A first operating condition of no body-biasing was considered, followed by a second operating condition wherein body-biasing was applied. It was discovered that a generally thicker dielectric layer (e.g., dielectric 118 of transistor 100) resulted in significantly improved flicker noise reduction during forward body-biasing operation of the transistor.

Market expectations, operating speeds, and other factors are driving electronic design toward progressively smaller constructs. Generally, a thinner dielectric material results in a higher current and/or higher transconductance (gm). As a result, devices are typically designed in accordance with the smallest (or nearly so) physical dimensions functionally plausible within a respective environment. In the context of MOSFET transistors, minimum dielectric thickness generally corresponds to the minimum gate (channel) length dimension of the gate. Thickening of the dielectric material to some value appreciably greater than the minimum runs counter to the prevailing trend in the electrical engineer arts. The present inventors contemplate that the balancing of opposed design goals (e.g., increased operating speed vs. reduced flicker noise, etc.) will lead to "optimized" dielectric thickness selection within any particular implementation.

While one non-limiting illustration of dielectric thickness is described above, the present teachings contemplate use of any plausible dielectric thickness within a particular embodiment. Furthermore, two or more layers of dielectric material, each having a respective k-value (i.e., dielectric constant), can also be used to define an overall dielectric material separating the gate from the underlying semiconductor substrate (i.e., channel region). Thus, the present teachings are non-limiting and directed to any and all dielectric thicknesses applicable to use with the forward body-biasing techniques presented herein.

Figure 4:
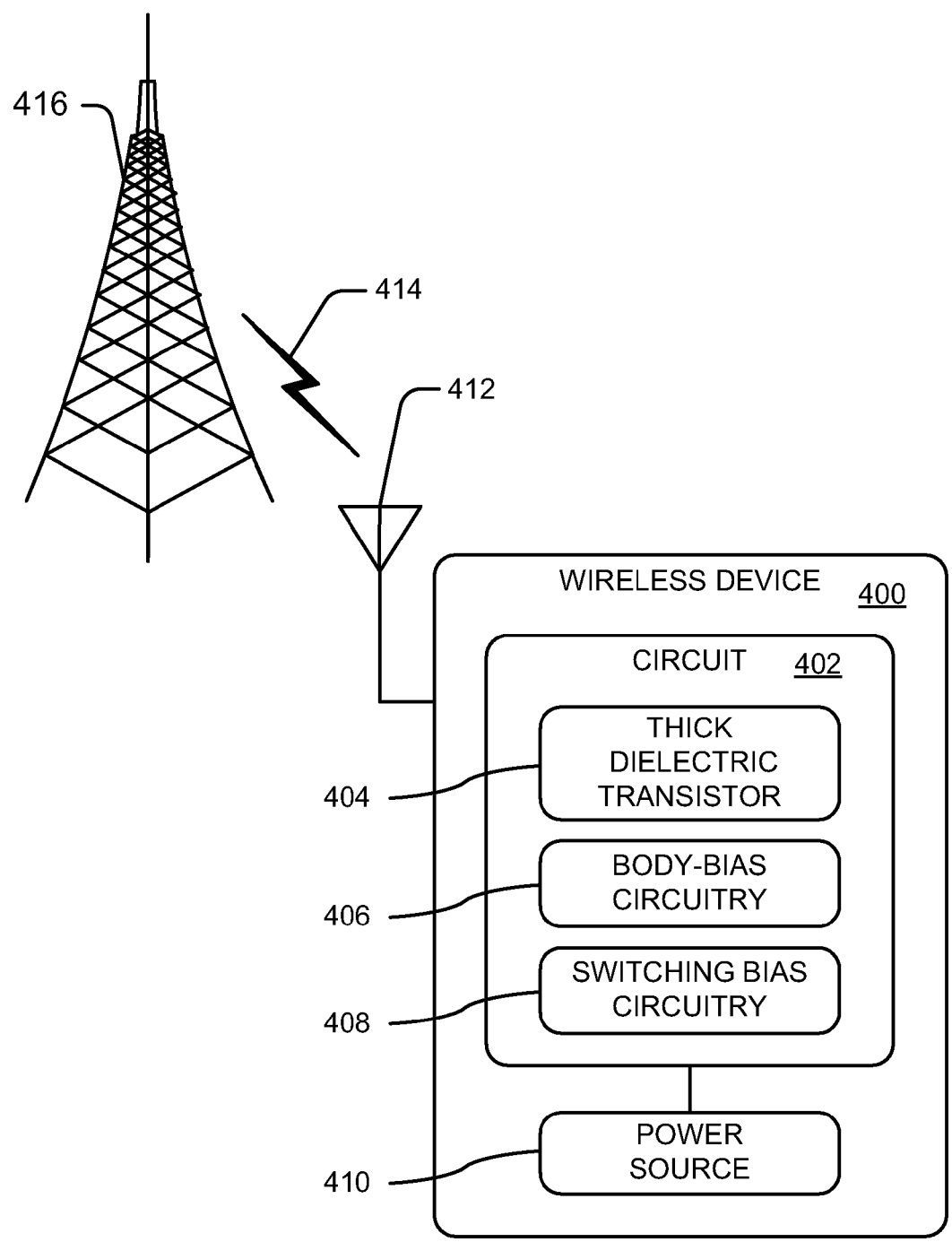
FIG. 4 is a block diagrammatic view depicting an apparatus including aspects of the present teachings.

Illustrative Apparatus Implementing the Gate Dielectric Thickness Implementation FIG. 4 is a block diagrammatic view depicting a wireless device (i.e., apparatus) 400 including aspects of the present teachings. For purposes of non-limiting example, the wireless device 400 is presumed to include various resources that are not specifically depicted in the interest of clarity. The wireless device 400 is further presumed to be configured to perform in one or more wireless operating modes (e.g., mobile cellular communications, global positioning system (GPS) reception, etc.).

The wireless device 400 includes a circuit 402. The circuit 402 includes, among other possible features, a relatively thick dielectric transistor (transistor) 404. The transistor 404 includes a generally thickened dielectric layer (and/or a gate dielectric with a reduced relative dielectric constant) such that flicker noise is reduced below some selected threshold during body-biasing operation and/or out-of-supply-voltage range operation according to the present teachings. For purposes of non-limiting example, it is assumed that the transistor 404 is substantially equivalent to the transistor 100 having a dielectric layer 118 of about 5.2 nm thickness. Other transistors 404 having other respective characteristics can also be used in accordance with the teachings herein.

The circuit 402 also includes body-bias circuitry (circuit portion) 406. The body-bias circuitry 406 is configured to provide a switched body-biasing potential to the transistor 404 according to the present teachings. It is further assumed that the body-bias circuitry 406 is configured to provide a forward body-biasing signal during the "off" state of the transistor 404.

The circuit 402 further includes switching bias circuitry (circuit portion) 408. The switching bias circuitry 408 is configured to provide a switched biasing or control potential to the transistor 404. For purposes of non-limiting example, it is assumed that the switching bias circuitry 408 is coupled to a gate terminal (not shown) of the transistor 404. It is further assumed that the switching bias circuitry 408 is configured to provide a control bias signal that drives the transistor 404 into an "on" or electrically conductive state and an "off" or electrically non-conductive state.

The body-bias circuitry 406 may, in some implementations, be configured to provide a body-biasing signal that is 180° out of phase to the switching bias signal provide by the circuitry 408. In one or more implementations, the body-bias circuitry 406 simply inverts the switching bias signal so that a one-hundred eighty degree phase difference is present between the body-biasing and switching bias signals. Such inverting body-bias circuitry 406 may further scale and/or offset the switching bias signal so as to derive the body-biasing signal provided to the transistor 404. Other schemes may also be used that relate the body-biasing signal to the switching bias signal. In turn, the transistor 404 may be part of any circuit resource required by the wireless device 400 such as, for non-limiting example, a current source, an oscillator, a mixer, etc.

The wireless device 400 further includes a source of electrical energy or "power source" 410. In one or more implementations, the power source 410 is defined by one or more batteries. In other implementations, the power source 410 may be defined by an inductively coupled power supply that is energized by an electromagnetic illumination field provided by some entity external to the wireless device 400. Other types of power source 410 may also be used. In any case, the power source 410 is coupled so as to provide electrical energy to the circuit 402. In this way, the wireless device 400 is presumed to be operable in a portable manner.

The wireless device 400 further includes an antenna 412. The wireless device 400 is presumed to operate by way of wireless signals 414 between the antenna 412 and a wireless network 416. A single cellular tower 416 is depicted in the interest of simplicity. However, it is to be understood that other resources (not shown) of a corresponding wireless network are also present and operative as needed so as to enable the wireless device 400 to perform its various functions (cellular communications, Internet access, etc.). The wireless device 400 is a general and non-limiting example of countless devices and systems that may be configured and operating in accordance with the means and techniques of the present teachings.

Illustrative Dielectric Thickness Method

Figure 5:
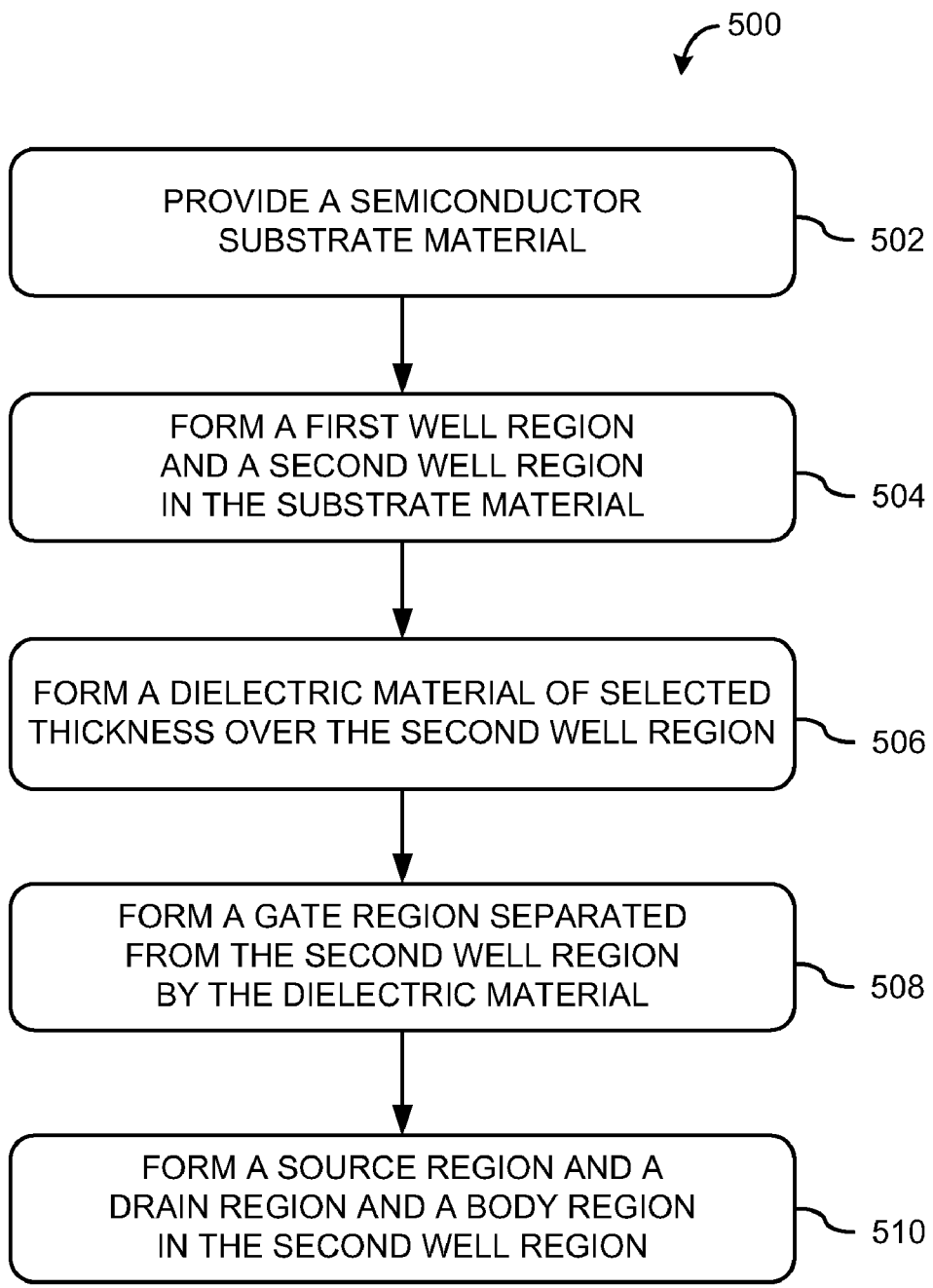
FIG. 5 is a flow diagram depicting a method according to the present teachings.

FIG. 5 is a flow diagram depicting a method 500 according to the present teachings. The method 500 includes particular steps and order of execution. However, it is to be understood that other methods respectively including other steps, and/or omitting one or more of the depicted steps, and/or proceeding in other orders of execution may also be used in accordance with the present teachings. In the interest of clarity, method 500 will be described with reference to FIG. 1.

At 502, a semiconductor substrate material is provided. The substrate material may be silicon or any other suitable material. As a non-limiting example, a substrate 102 is presumed to be provided.

At 504, a first well region is formed within the substrate material, and a second well region is formed within the first well region. The first and second well regions are of respectively opposite doping types. The formation may include, for example, ion implantation (or plasma doping, etc.) of a dopant element so as to define the respective wells as n-type and p-type. For purposes of non-limiting example, it is assumed that a first n-well 110 is formed in the substrate 102, and a second p-well 108 is formed within a portion of the n-well 110.

At 506, a dielectric material is formed over the second well region. The dielectric material is defined by a selected (i.e., optimized) thickness and/or dielectric constant such that a flicker noise characteristic of the resulting active device (i.e., transistor) is reduced below a predetermined threshold amount when the active device is operating in a body-biased or out of supply voltage range signal switching mode. The dielectric may be constructed of one or more layers which may comprise one or more of the same or different materials and may be graded, e.g. the dielectric may have a higher dielectric constant at the gate electrode and a lower dielectric constant at the semiconductor interface, or vice versa. The grading can be arranged in a stepwise manner, achieved by subsequent stacked layers having different dielectric constant or in a continuous manner by diffusing a dopant into the gate dielectric that changes the dielectric constant continuously.

At 508, a gate region is formed over the second well region. The gate region may be a metal such as aluminum (Al), TiN (Titan Nitride) or TaN (Tantalum Nitride) maybe containing also zirconium (Zr), doped polysilicon (Si) or another suitable conductive material. In any case, the gate region is physically separated from the well region by the dielectric material formed at 508 above. For purposes of non-limiting example, it is assumed that a TiN, TaN, or poly silicon gate 114 is formed over the dielectric material 118. In this way, a complete MOSFET device configured for body-biased operation in accordance with the present teachings has been defined.

At 510, a source region, a drain region and a body region are respectively formed within the second well formed at 504 above. The formed source and drain will be of opposite type with respect to the second well, while the body region is formed of the same types as the second well. For purposes of non-limiting example, it is assumed that an n-type drain region 106, an n-type source region 104, and a p-type body region 112 are formed within the p-well 108.

In the foregoing and/or other implementations, respective electrically conductive terminals may be connected to the source, drain, gate, and/or body regions of the resulting active device.

First Illustrative Transistor/Variable Resistive Element Implementation

Disclosed herein are improved techniques for reduced flicker noise that are applicable, for example, to semiconductor devices. Techniques in accordance with the present disclosure may advantageously improve performance and reliability of such devices by improving noise behavior and reducing current consumption. In general, techniques for signal processing having a reduced flicker noise as taught by the present disclosure may use an active device receiving a forward body-bias signal. This process may, according to one implementation for an N-type transistor, entail lowering the gate voltage below the transistor's threshold voltage and increasing the substrate voltage. The forward body-bias signal maybe used in conjunction with a variable resistive device that acts to reduce current consumption during gate to substrate biasing and to ensure the transistor is in strong accumulation during biasing.

According to an implementation, an apparatus includes an active device, such as a transistor, and a variable resistive element, which may also be a transistor, structured in a semiconductor body. The active device includes a gate terminal to receive a control signal, a source terminal, a drain terminal, and a bulk terminal to receive a body-bias signal. The apparatus also includes a variable resistive element connected to the source terminal of the active device. The variable resistive element may include a control terminal to switch it between a low resistive state and a high resistive state, a source terminal which may be connected to ground, and a drain terminal connected to the source of the active device.

According to additional or alternative implementations, the apparatus may be configured to receive a body bias signal to the bulk terminal and to the source terminal.

According to another implementation, the apparatus may be connected in parallel to a similar apparatus to create a current source. According to another implementation, the apparatus may be connected in series to form an inverter.

According to another implementation, four apparatuses may be arranged to form a double branch inverter. According to other implementations, the apparatuses may be arranged into a PMOS only VCO circuit, a CMOS VCO circuit, a NMOS only double branch VCO circuit, or a single or double balanced Gilbert mixer.

Circuits and functional aspects provided herein can be fabricated, at least in part, on a common substrate such that one or more respective integrated circuit devices are defined. In one or more implementations, at least a portion of the functional subject matter presented herein can be fabricated within a 250, 180, 130, 90, 65, 45, or 32 nanometer (or smaller) environment.

The techniques described herein may be implemented in a number of ways. Illustrative context is provided below with reference to the included figures and ongoing discussion.

Figure 6:
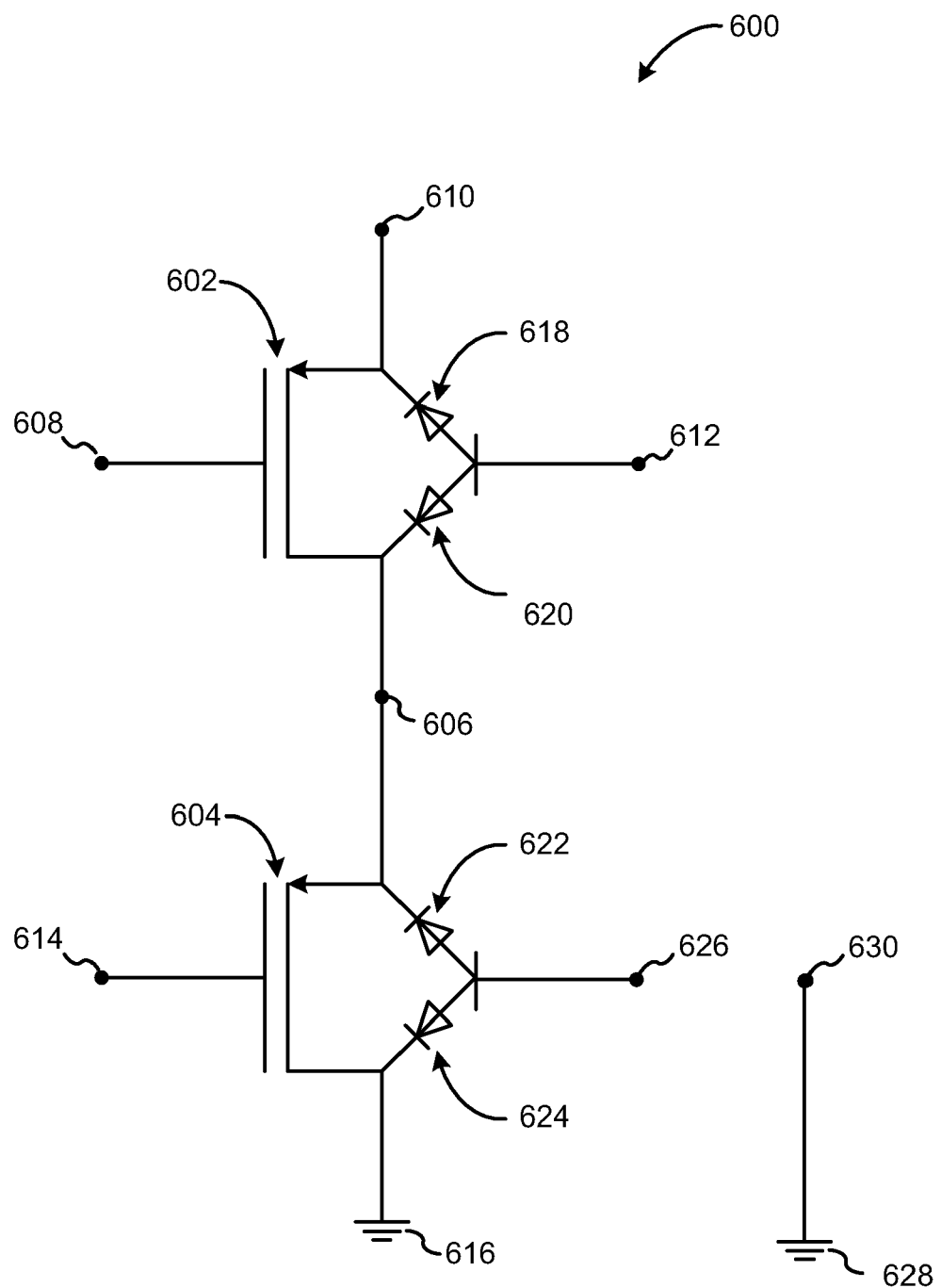
FIG. 6 is a schematic diagram showing an apparatus having a transistor and a variable resistive element.

FIG. 6 shows an implementation of an apparatus 600 formed in a semiconductor body comprising an active device 602 and a variable resistive element 604. The active device 602 may be a field effect transistor having a source terminal 606, a gate terminal 608, a drain terminal 610, and a bulk terminal 612. The active device 602 may be formed on or within a substrate or substrate layer and may be formed in a semiconductor material, such as Silicon or Gallium-Arsenide. It is readily understood by one skilled in the art that any other suitable semiconductor material may be used according and that the substrate may be a bulk semiconductor material or may have a semiconductor material layer formed upon another support substrate. The variable resistive element 604, which may also be a transistor, may have a gate terminal 614, a grounded (source) terminal 616, a drain terminal 606, and a bulk terminal 626. Thus, terminal 606 serves as a drain terminal of the variable resistive device 604 and the source terminal of the transistor 602. The diodes 618 and 620 on transistor 602 are merely representative of the diode junctions that exist between the drain terminal 610 and bulk terminal 612 and between the source terminal 606 and bulk terminal 612, i.e., no additional diodes are attached to transistor 602. Similarly, diodes 622 and 624 on variable resistive element 614 are merely representative of the diode junctions that exist between the drain terminal 606 and bulk terminal 626 and between the ground (source) terminal 616 and bulk terminal 626. Thus, no additional diodes are attached to variable resistive element 614.

The exemplary active device 602 is shown as an n-type MOSFET transistor. However, the transistor 602 is non-limiting and the present disclosure also contemplates application of the described techniques to any other transistor, such as a p-type MOSFET transistor, or other suitable transistor device. The exemplary variable resistive element 604 is shown as an n-type MOSFET transistor. However, the variable resistive device 104 is shown and described only by way of non-limiting example and the present disclosure contemplates application of the described techniques to any other variable resistive element. Moreover, a bulk terminal 626 of variable resistive element 604 may optionally be connected (via a switch or fixed coupling) to a ground 628 via terminal 630.

Figure 7:
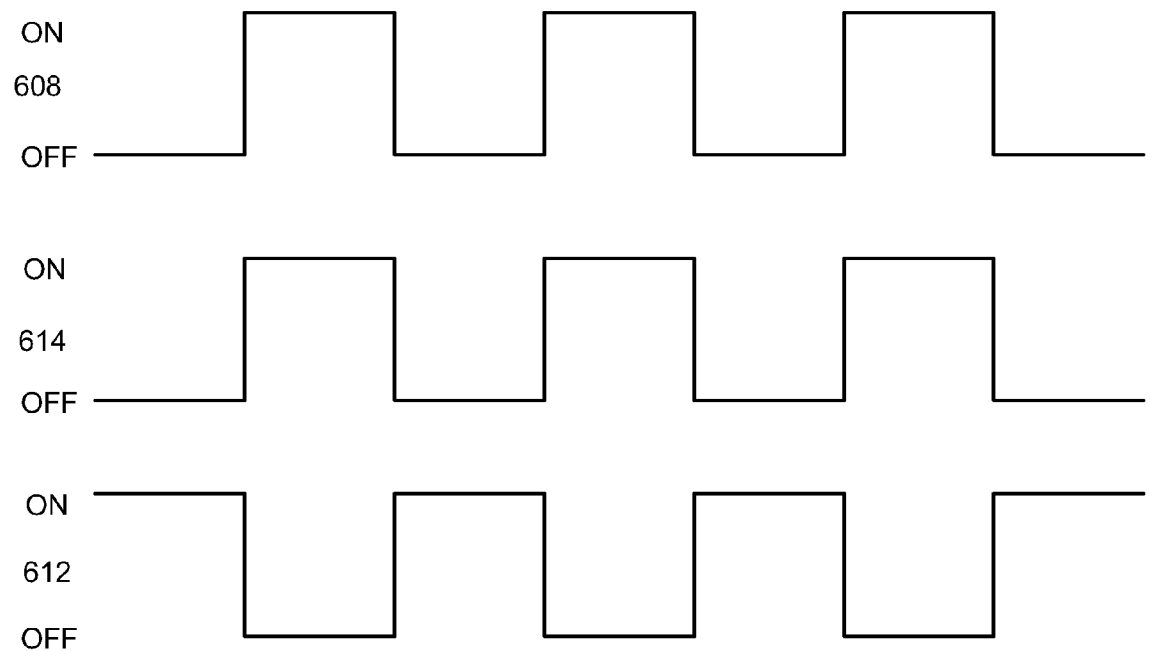
FIG. 7 is an exemplary timing diagram for use in operation of the apparatus shown in FIG. 6.

Illustrative Timing Diagram/Method for Transistor/Variable Resistive Element Implementation FIG. 7 shows a timing diagram that may be used in the operation of the apparatus in FIG. 6. Transistor 602 is turned "on" or "off" via gate terminal 608. The variable resistive element 604 is turned switched between a low resistive state and a high resistive state via gate terminal 614. Transistor 602 receives its forward body-biased voltage via bulk terminal 612. The forward body-bias signal provided to the bulk terminal 612 is out-of-phase with the gate signal provided to the gate terminal 608. The forward body-bias signal is switched "off" before the variable restive element 604 is switched to a low resistive state. Then, the transistor 602 is switched "on." The variable resistive element 604 is then turned to a high resistive state before the forward body bias signal is applied to transistor 602 at terminal 612.

The variable resistive element 604 being in a high resistive state ("off") isolates the transistor 602 from the reference ground 616 and/or the rest of the circuit. The control signal may then be reduced (i.e. set to a "low" value) and the forward body bias may be applied at 612 to create a strong accumulation state.

When the variable resistive element 604 is "on," it creates a low resistive connection that acts as a short circuit for the source terminal 606 to reference ground 616 or to the rest of the circuit. If the variable resistive element 604 is a transistor, it will need a gate width-to-length ratio (W/L) high enough to establish a low resistive condition such that the current in the transistor 602 is not affected by the variable resistive element 604 during the "on" state of the transistor 602.

Second Illustrative Transistor/Variable Resistive Element Implementation

Figure 8:
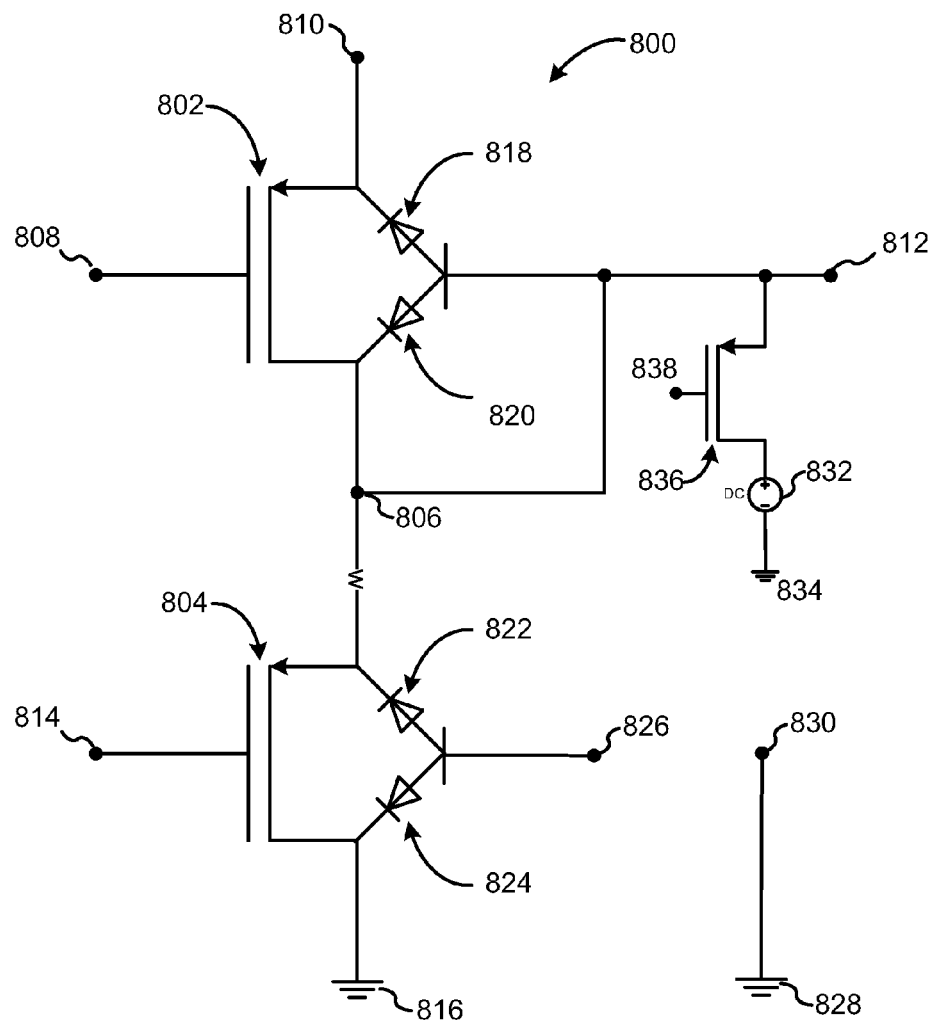
FIG. 8 is a schematic diagram showing a transistor connected to a variable resistive element with bulk and source terminal of the transistor shorted together and an associated timing diagram.
Figure 8:
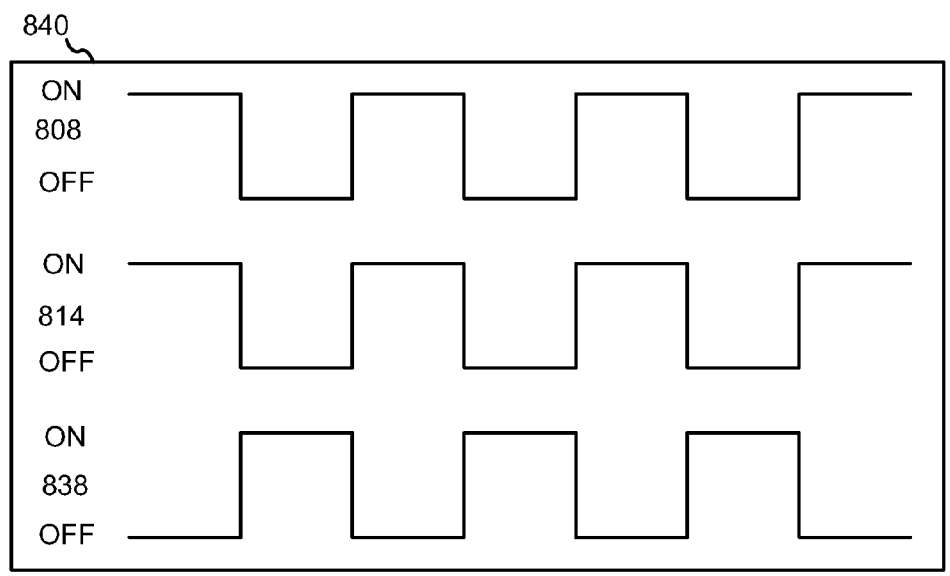

FIG. 8 illustrates an apparatus 800 similar to apparatus 600, shown in FIG. 6, but including a connection between the bulk terminal 812 and the transistor source terminal 806. The diodes 818 and 820 on transistor 802 are merely representative of the diode junctions that exist between the drain terminal 810 and bulk terminal 812 and between the source terminal 806 and bulk terminal 812, no additional diodes are attached to transistor 802. Similarly, diodes 822 and 824 on variable resistive element 804 are merely representative of the diode junctions that exist between the drain terminal 806 and the source terminal 816, no additional diodes are attached to variable resistive element 804. The bulk body signal is provided by a voltage source 832, which is connected to ground or reference potential 834, and controlled by a transistor 836 via gate terminal 838. The bulk body signal operates per the timing diagram 840.

Third Illustrative Transistor/Variable Resistive Element Implementation

Figure 9A:
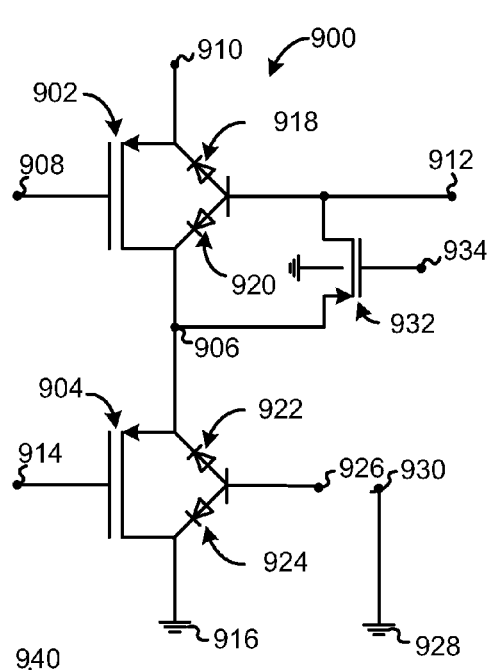
FIG. 9a is a schematic diagram showing a transistor connected to a variable resistive element with the transistor having controlled source biasing.
Figure 9A:
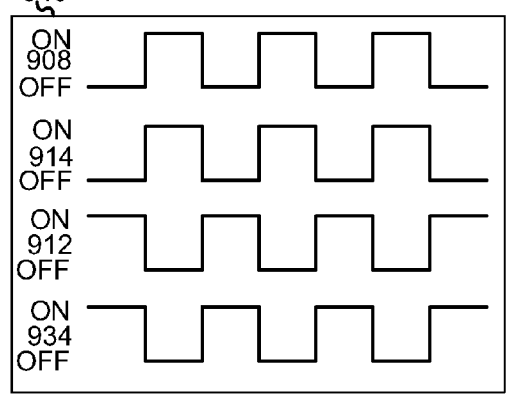

FIG. 9a demonstrates an implementation similar to that shown in FIG. 8. However, in apparatus 900, the bulk to source terminal connection 912-906 includes a control transistor 932 that enables the engagement of the bulk to source connection independent of the forward body-bias signal. Control transistor 932 may be turned "on" and "off" via gate terminal 934 at the same time as the forward body-bias signal is applied to the bulk terminal 912, as shown in timing diagram 940. The diodes 918 and 920 on transistor 902 are merely representative of the diode junctions that exist between the drain terminal 910 and bulk terminal 912 and between the source terminal 906 and bulk terminal 912, no additional diodes are attached to transistor 902. Similarly, diodes 922 and 924 on variable resistive element 904 are merely representative of the diode junctions that exist between the drain terminal 906 and bulk terminal 926 and between the source terminal 916 and bulk terminal 926, no additional diodes are attached to variable resistive element 904.

Figure 9B:
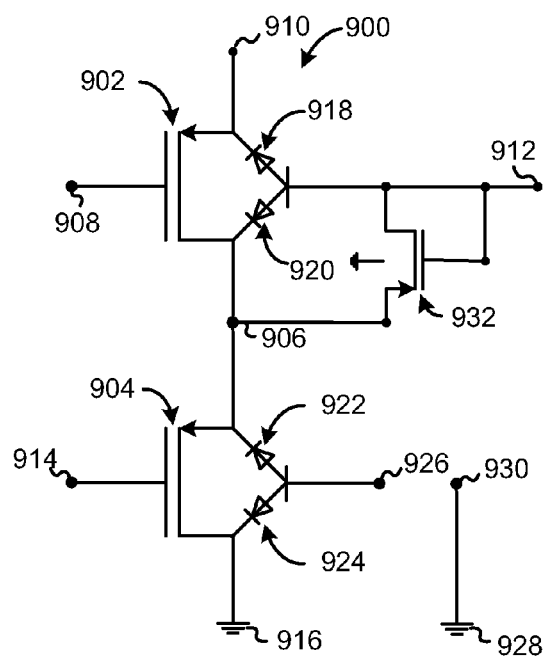
FIG. 9b is a schematic diagram showing a transistor connected to a variable resistive element with bulk and source of the transistor connected by another transistor.
Figure 9B:
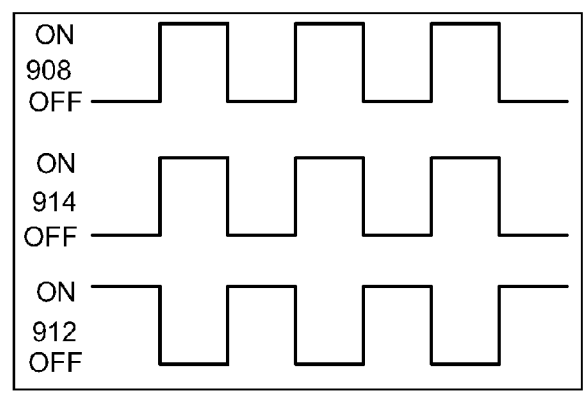

FIG. 9b demonstrates an implementation similar to that shown in FIG. 9a except that the bulk to source terminal control transistor 932 may only be turned on when the forward body-bias signal is on. The diodes 918 and 920 on transistor 902 are merely representative of the diode junctions that exist between the drain terminal 910 and bulk terminal 912 and between the source terminal 906 and the bulk terminal 912, no additional diodes are attached to transistor 902. Similarly, diodes 922 and 924 on variable resistive element 904 are merely representative of the diode junctions that exist between the drain terminal 906 and bulk terminal 926 and between the source terminal 916 and bulk terminal 926, no additional diodes are attached to variable resistive element 904.

When applying a body biasing technique to a transistor (e.g. 602, 802, or 902), the resistive element (e.g. 604, 806, or 904,) is connected to the source of the transistor (e.g. 602, 802, or 902) where the noise should be quenched. For the body bias technique, the resistive element (e.g. 604) could be an NMOS or PMOS transistor combined with an NMOS or PMOS transistor (e.g. 602).

FIG. 10a shows an example of applying to a transistor (e.g. 1002) an out of supply voltage range signal PN $V_g$, as defined further herein below as applying to voltages that may be above or below the operating drain to source or gate to source voltage required for reliable operation of the device. For an NMOS device, "out of supply" can also mean a control signal below source, drain and bulk voltage; for a PMOS out of supply could also mean a control signal above the potential of drain, source and bulk. When supplying an out of supply voltage range signal to the transistor (1002), the resistive element 1004 may be added to the drain 1006 of the transistor where the noise should be quenched. For an NMOS transistor, the resistive element 1004 connected to the drain 1006 of the transistor 1002 may be a PMOS transistor or an NMOS transistor.

According to one implementation, the transistor 1002 whose noise should be quenched is e.g. an NMOS transistor. The source and bulk of this transistor 1002 are connected to ground 1008 at 0V. The drain 1006 of this transistor 1002 maybe at a voltage of +1V. The technology has a gate dielectric that withstands a voltage of 1V. If an out of supply voltage signal (e.g. −1V) is supplied to the gate of this NMOS transistor, the largest voltage difference between gate and drain is 2V, which may damage or destroy the NMOS transistor. Thus, the resistive element 1004 may be provided at the drain to disconnect the drain to generate a floating potential, as shown in FIG. 10a at the drain 1006 before at the gate the out of supply voltage range signal is provided.

FIG. 10b shows another alternative implementation in which the drain of the transistor 1002 is connected after it is disconnected from the rest of the circuit via the resistive element 1004 to the source potential via the NMOS transistor 1010 and afterwards the out of supply voltage range signal is provided to the gate of transistor 1002. The resistive element 1004 may preferably be a PMOS transistor if the transistor whose noise should be quenched is an NMOS transistor and vice versa for a PMOS transistor. It is appreciated that there could be placed between the resistive element (e.g., 1004) and the drain of the transistor (e.g., 1006), shown in FIGS. 10a and b, other active or passive devices in series.

The body bias technique, shown with respect to the resistive element, could also be applied to an NMOS transistor (same holds for PMOS transistor to be combined with an PMOS resistive element).

Another modification to the body bias technique is that in case of the out of supply voltage range technique there could be placed between the resistive element (e.g., 1004) and the drain of the transistor (e.g., 1006) other active or passive devices in series.

Figure 11:
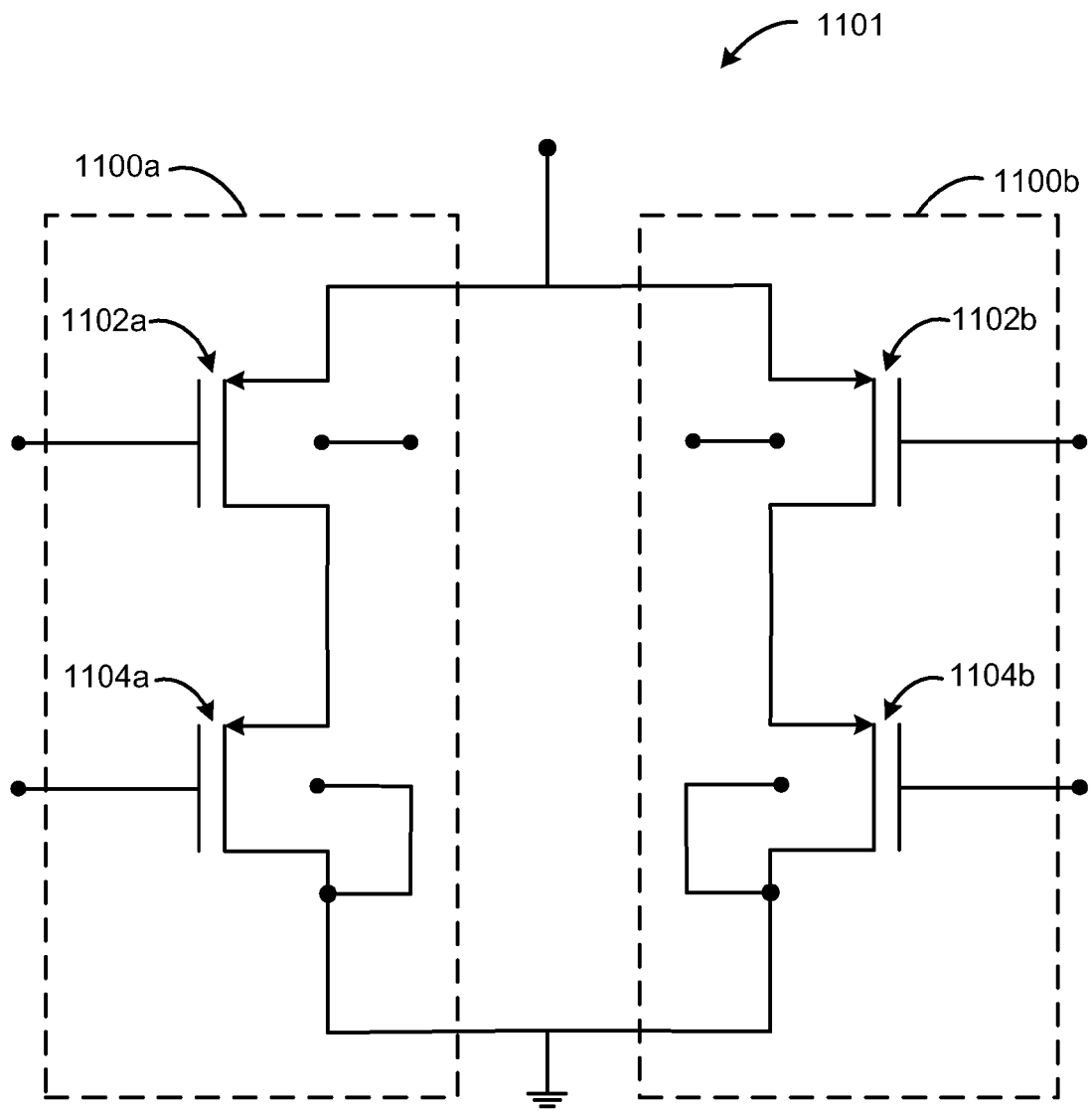
FIG. 11 is a schematic diagram showing an implementation of the apparatus showing in FIG. 6 as a current source.

Illustrative Transistor/Variable Resistive Element Current Source Implementation FIG. 11 demonstrates the combining of a first apparatus 1100a, which may be configured similar to apparatus 600, 800, 900, or according to any other suitable configuration, with a second apparatus 1100b, may also be configured similar to apparatus 600, 800, 900, or according to any other suitable configuration, in order to form a current source 1101.

The first apparatus 1100a is shown as a combination of a transistor 1102a and a variable resistive element 1104a. The second apparatus 1100b may be similar or identical to the first apparatus 1100a. Moreover, the first apparatus 1100a and second apparatus 1100b may be connected in a parallel configuration.

Illustrative Transistor/Variable Resistive Element Inverter Implementation

Figure 12:
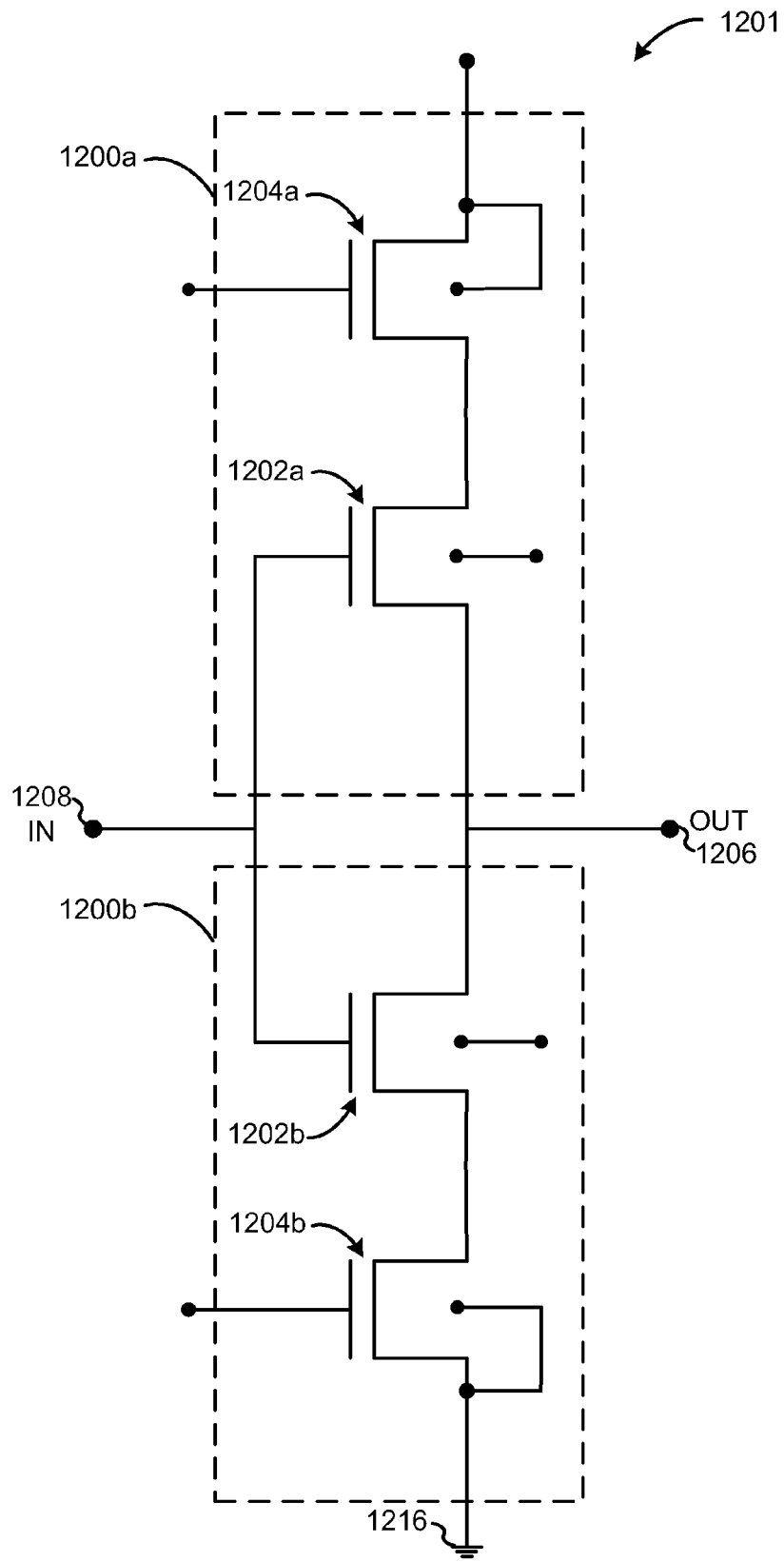
FIG. 12 is a schematic diagram showing an implementation of the apparatus shown in FIG. 6 as an inverter.

FIG. 12 demonstrates the combination of a first apparatus 1200a with a second apparatus 1200b and configured to form an inverter 1201. The first apparatus 1200a includes at least one transistor 1202a and variable resistive element 1204a, the second apparatus 1200b includes at least one transistor 1202b and includes a variable resistive element 1204b. First and second apparatuses 1200a and 1200b are mirrors of each other with one being PMOS (1200a) and the other being NMOS (1200b). Though the PMOS 1200a and the NMOS 1200b are shown as single transistors, it is appreciated that the PMOS 1200a may be a circuit that includes PMOS and NMOS transistors and the NMOS 1200b may be a circuit that includes NMOS and PMOS transistors. In the event that the PMOS block 1200a includes one or more NMOS transistors, no forward body bias would be applied to the NMOS transistors, i.e. the forward body bias may be applied only to the noisy PMOS transistors of the PMOS block. In the event that the NMOS block 1200b includes one or more PMOS transistors, no forward body bias would be applied to the PMOS transistors, i.e. the forward body bias may be applied only to the noisy NMOS transistors of the NMOS block.

The variable resistive element 1204b may be connected to reference or ground voltage terminal 1216. The gate terminals of transistors 1202a and 1202b are connected to a common terminal 1208. Output terminal "OUT" 1206 may be a common terminal 1206 connecting source terminal of the PMOS transistor 1202a to the drain terminal of the NMOS transistor 1202b.

Figure 13:
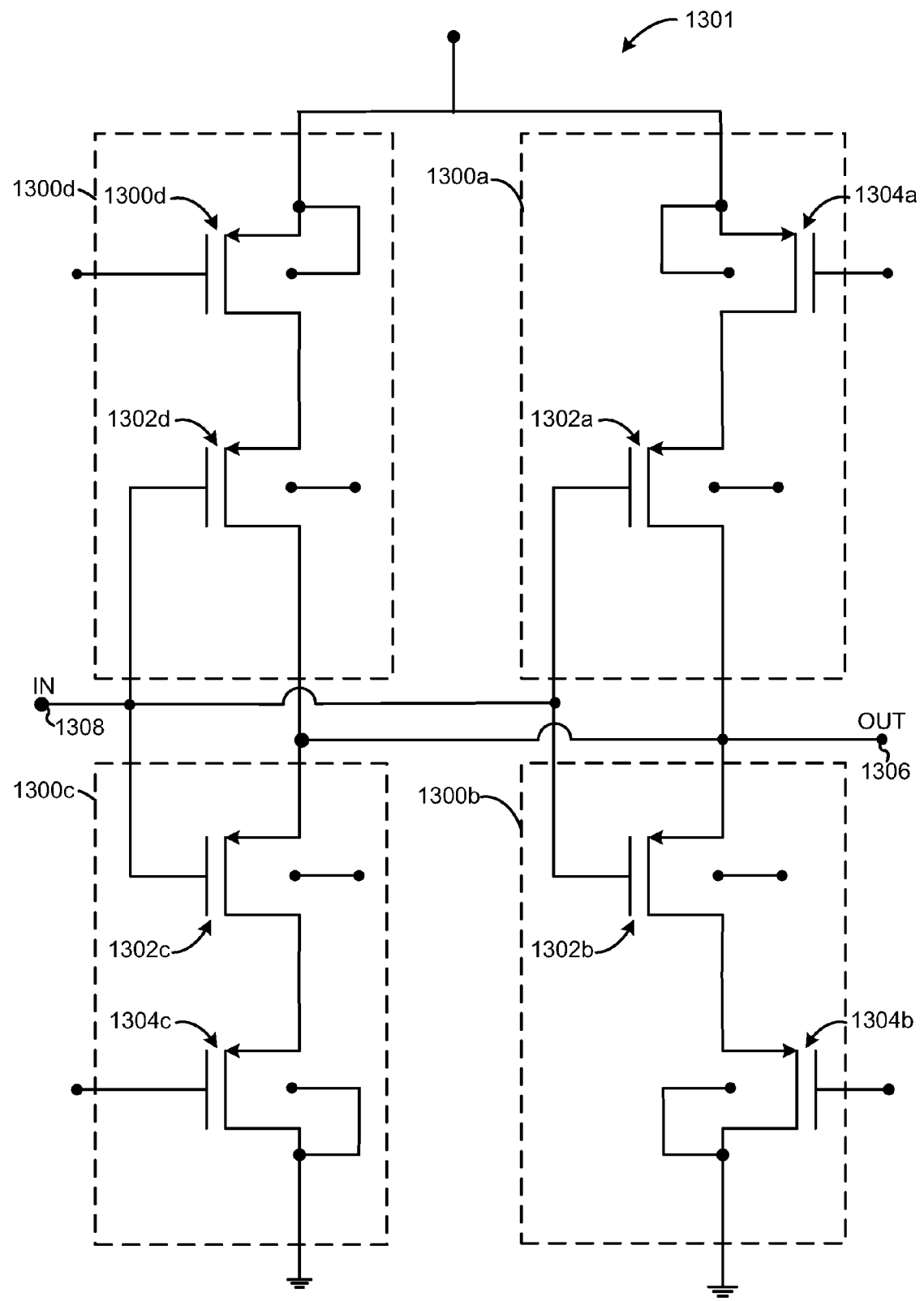
FIG. 13 is a schematic diagram showing an implementation of the apparatus shown in FIG. 6 as a double branch inverter circuit.

Illustrative Transistor/Variable Resistive Element Multi-branch Inverter Implementation FIG. 13 demonstrates the combination of four apparatuses 1300a-d, which may be configured similar to apparatus 600, 800, 900, or according to any other suitable configuration, to form a double branch inverter 1301. The first apparatus 1300a is connected in series with the second apparatus 1300b and both of them are connected in parallel to the third apparatus 1300c and the fourth apparatus 1300d. The third apparatus 1300c and the fourth apparatus 1300d are connected in series. An input signal 1308 and output signal 1306 is connected to both branches such that the first apparatus 1300a and the third apparatus 1300c are "on" while the second apparatus 1300b and fourth apparatus 1300d are "off". Or in the alternative, the first apparatus 1300a and second apparatus 1300b are "on" while the third apparatus 1300c and fourth apparatus 1300d are "off". In either mode, the two sets (e.g. 1300a/b and 1300c/d) will alternate between "on" and "off" such that the apparatuses that are "off" are subjected to forward body-biasing while the apparatuses that are "on" will be functioning normally. In effect, a seamless handover occurs between the two inverters (1300c/d and 1300a/b) as they alternate between "on" and "off". This example is shown with reference to inverters, but this concept may be extended to non-inverter devices to take advantage of the handover feature. Each 1300 series apparatus contains a transistor (e.g., 1302a, b, c, d) and a variable resistive element (e.g., 1304a, b, c, d).

Illustrative Method for Operating a Transistor/Variable Resistive Apparatus

Figure 14:
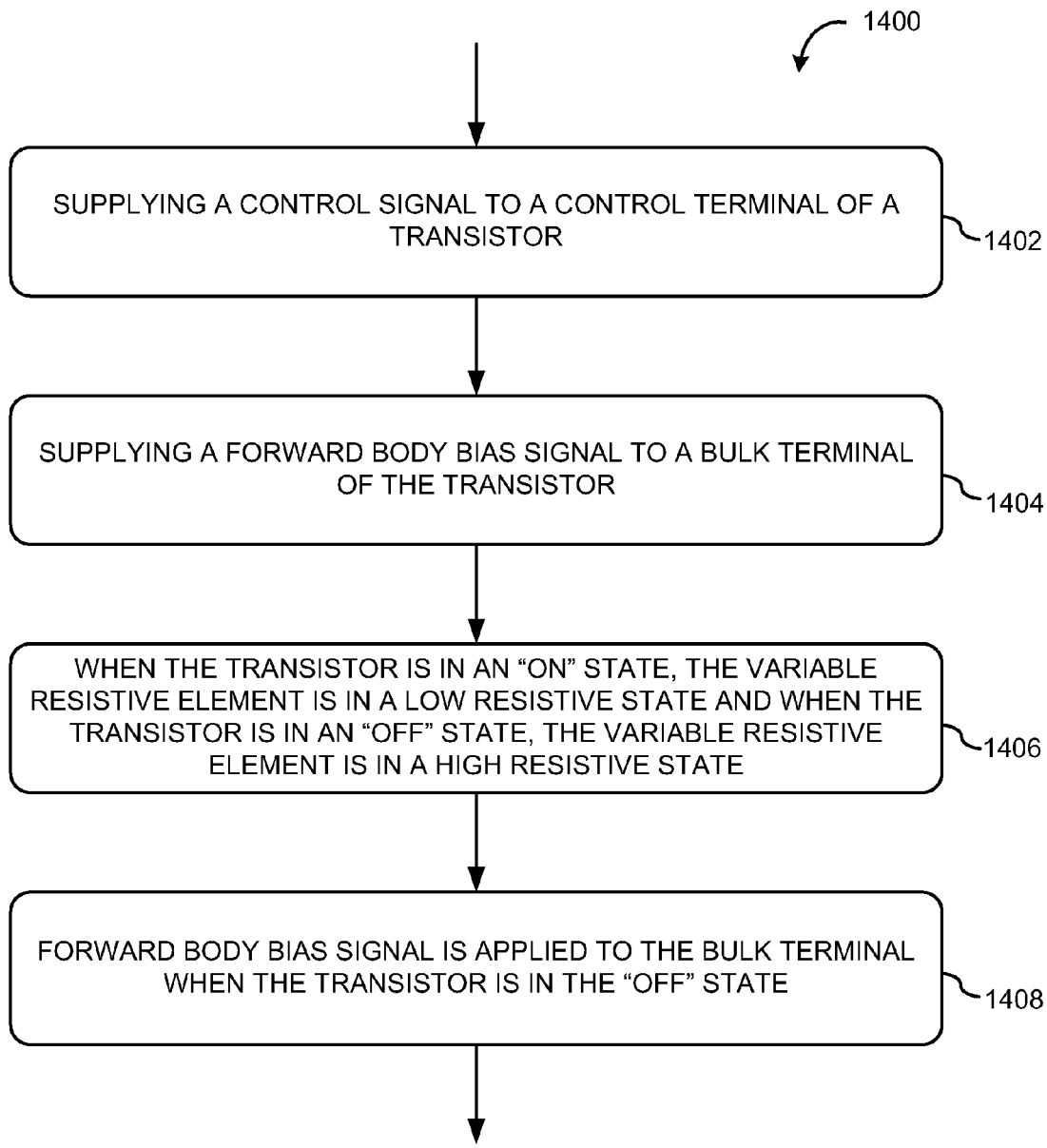
FIG. 14 is a flow diagram of one method in implementing the apparatus of FIG. 6.

FIG. 14 demonstrates the exemplary method 1400 of operation of an exemplary apparatus, such as apparatus 600.

At 1402, a control signal is supplied to a control terminal of a transistor. The control signal may originate from a control circuit or other circuit for directing and/or converting a supply voltage or other voltage source. According to one implementation, a control signal is supplied to gate terminal 608 for the transistor 602 to place the transistor in an "on" mode. According to this implementation, the variable resistive element 604 is in a "low" resistive state, and the forward body-bias signal is in an "off" state.

At 1404, the forward body bias signal is supplied to a bulk terminal of the transistor 602.

At 1406, a control signal is supplied to a control terminal 614 of a variable resistive element 604. According to this method, when the transistor 602 is in an "on" state, the variable resistive element 604 is in a low resistive state and when the transistor 602 is in an "off" state, the variable resistive element 604 is in a high resistive state.

Additionally or alternatively at 1408, the forward body bias signal is only applied to the bulk terminal 612 when the transistor 602 is in the "off" state.

Illustrative Multi Branch Implementation

The use of switching pair transistors is quite common in the electrical arts. A switching pair at its base level is two transistors in parallel where the current flow is alternating between the two transistors such that only one of the two transistor is being used at one time.

According to at least one implementation, flicker noise may be reduced by distributing the noise from one larger transistor to a plurality of smaller transistors that are turned "off" and "on" at different times in order to reduce the amplitude of spurious signals such that they have lower impact on the signals that are being processed. Thus, a plurality, or branches, of transistors in parallel may replace a single transistor.

According to this implementation, a basic switching pair consists of two active devices in parallel in which current is alternating between the two devices. More particularly, each active device may be replaced or substituted by a plurality of devices that are smaller than the primary device but that combine to provide the same performance characteristics of the larger active device. The plurality of devices may be connected in parallel.

According to another implementation, the sum of the gate widths of the plurality of transistors equals the gate width of the larger transistor they are replacing or substituting. For each plurality of transistors, another transistor, such as a switching transistor, may be added to the plurality or transistors to provide the capability to turn "off" one of the plurality of transistors, but still maintain full processing capability of plurality of transistors. This allows the "off" transistor to be subjected to a forward body-bias in order to reduce noise and power consumption, prevent lowering of the transistor's threshold voltage, and reduce parasitic capacitance in the transistor, while all the other transistors continue processing signals. According to this implementation, the switching transistor carries the load of the transistor that is turned off. When the forward body-biasing of the transistor is completed, the transistor is turned back "on" and the switching transistor it turned "off." This cycle will repeat among the other transistors as needed or determined by a pre-selected plan or a pseudo random way, e.g. through a statistical compensation algorithm that compensates for variations between devices by averaging their mismatch values and/or other mismatch shaping methods known in the art.

According to one implementation, a pair of switching devices are placed in parallel and are used in conjunction to operate as a differential amplifier.

According to another implementation, a single switching pair is placed in series with at least one control circuit that controls the rising gate signal and decreasing body signal of a first transistor against the decreasing gate signal and increasing body signal of a second transistor such that the total current or transconductance (gm) flowing through the entire circuit remains constant.

According to still another implementation, a switching pair or multibranch circuit is used in combination with a series of inverting amplifiers controlling the gate and body signals such that current flow or transconductance (gm) through the switching pair remains constant. The switching pair may also utilize the gate dielectric techniques discussed above.

Figure 15:
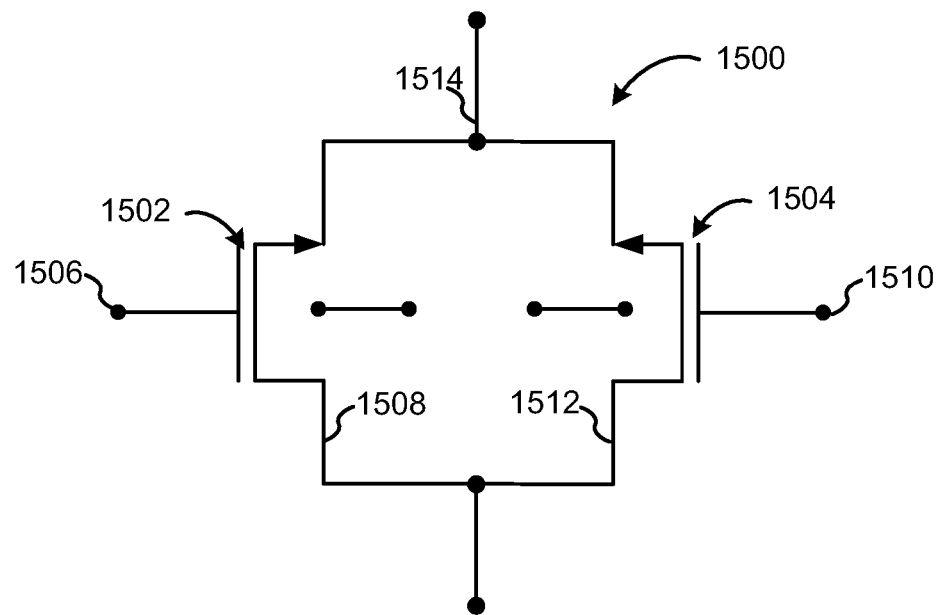
FIG. 15 is a schematic diagram of a basic switching pair and timing diagram for operating the switching pair.
Figure 15:
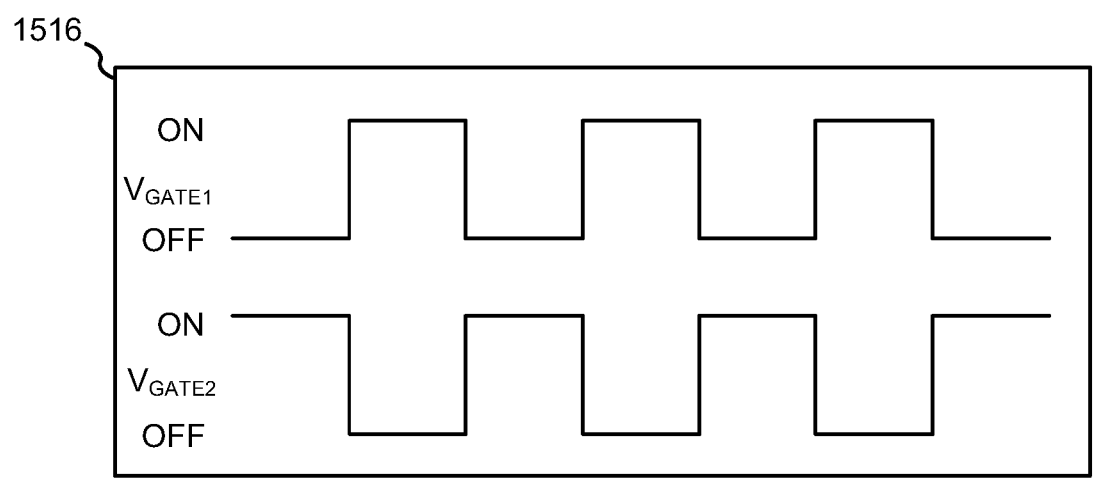

FIG. 15 shows a basic switching pair 1500 comprising a first transistor component 1502, which has at least one gate, drain, source and bulk terminal, in which the first transistor component connected in parallel to a second transistor component 1504 also having at least one gate, drain, source, and bulk terminal. Although the first and second transistor components 1502 and 1504 are shown as single transistors, they may include multiple transistors as will be described in more detail below. The first transistor component 1502 may be a transistor having a control terminal 1506 and current path 1508. The second transistor component 1504 may be a second transistor having a control terminal 1510 and current path 1512. Total current flow across current path 1514 consists of the sum of the current flow across current path 1508 and the current flow across current path 1512. The timing diagram 1516 shows the control signals [$V_{GATE1}$ and $V_{GATE2}$] of both transistor components 1502 and 1504 being alternated such that they are not in an "on" state at the same time.

Figure 16:
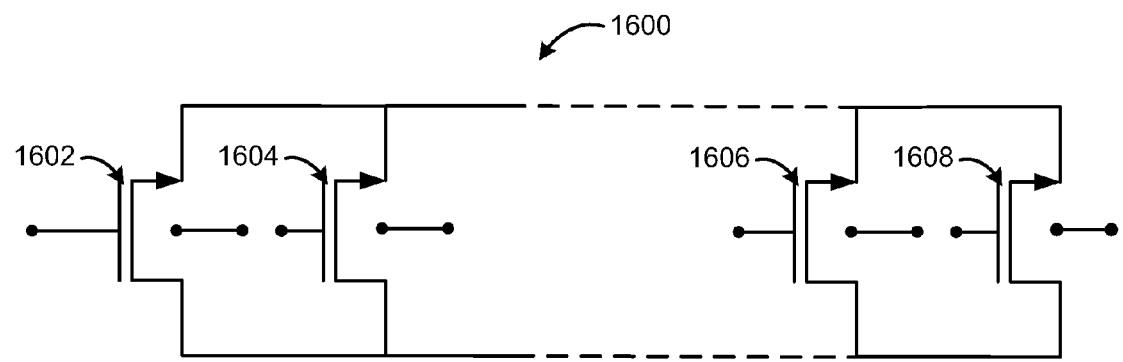
FIG. 16 is a schematic diagram of a multi-branch switching topology.

FIG. 16 is a schematic representation of a circuit 1600 incorporating a multi-branch configuration. A plurality of transistors 1602-1606 represents the equivalent of the first transistor component 1502 and/or the second transistor component 1504. The number of transistors may vary and the number shown here is not intended to be limiting of the actual number of transistors that may be used. A switching transistor, e.g. transistor 1608 is also shown connected in parallel with the plurality of transistors 1602-1606. Each of the transistors in FIG. 16 has gate, drain, source, and bulk terminals and their gate widths may be selected to be similar or identical. During normal operations, at least one of the transistors in parallel is turned "off." For example, as an "on" transistor is transitioned to an "off" state, the "off" transistor will transition to an "on" state. During the "off" state the transistor may be subjected to forward body-biasing or out of supply voltage range techniques.

The "off" transistor may be selected in a predetermined, random, pseudo-random, or sequential manner. The selection criteria can be directed by analyzing mismatch of electrical features (current, transconductance, threshold voltage, and so forth) between the transistors either individually or by using an averaging method. For example, given four transistors with different threshold voltage characteristics, a first transistor with a first threshold voltage feature that is closest to one of the other three transistors would be switched with that transistor with the nearest matching threshold voltage feature, such that one transistor is on, while the other transistor is off. Then, the next two transistors with the next closest matching threshold voltage features would be switched, such that one transistor is "on," while the other transistor is "off." According to another method, the transistors are sequentially turned "off" and "on," based on criteria, such as location, but irrespective of any mismatch criteria.

FIG. 17 is a schematic representation of a differential amplifier 1701 using two switching pairs 1700a/1700b connected in series with a current source 1712. The first switching pair 1700a has a first transistor 1702a having a control signal terminal 1706a for receiving control signal $V_{GATE}$ 1a and a second transistor 1704a having a control signal terminal 1708a for receiving $V_{GATE}$ 2a. The second switching pair 1700b has control signal terminals 1706b for receiving control signal $V_{GATE}$ 2b and 1708b for receiving control signal $V_{GATE}$ 1b. As shown in the timing diagram the voltages are operating in a alternating manner.

Figure 18:
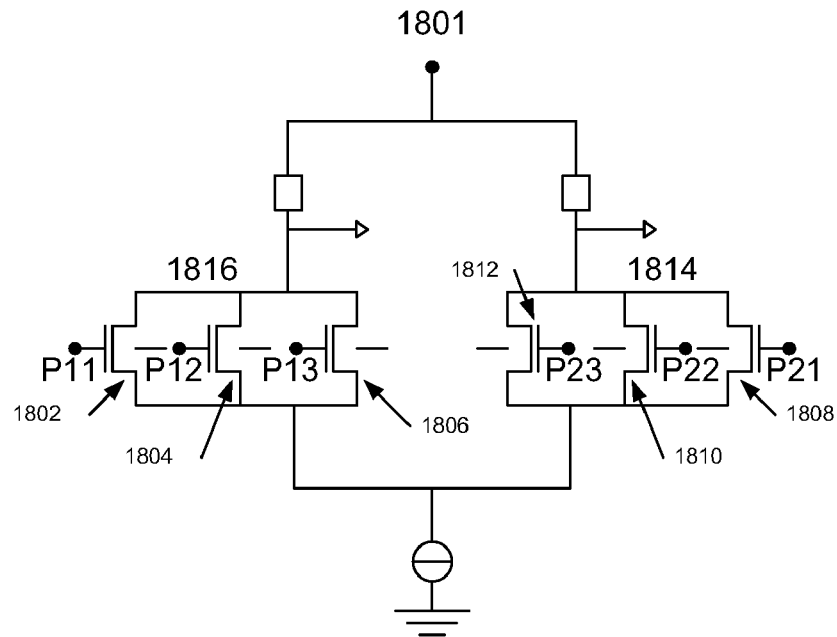
FIG. 18 is a schematic diagram and timing diagram for operating a differential amplifier utilizing two multi-branch switching pairs.
Figure 18:
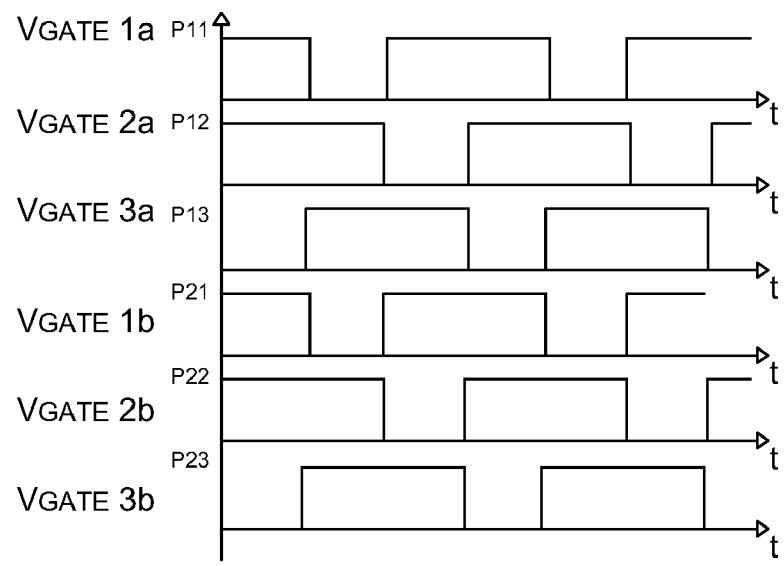

FIG. 18 is a schematic representation of a differential amplifier 1801 that is similar to the differential amplifier 1701 shown in FIG. 17. However, the switching pair devices 1700a and 1700b of differential amplifier 1701 are replaced with multi-branch devices. Switching pair 1700a is replaced by multi-branch 1816 and switching pair 1700b is replaced with multi-branch 1814. The first multi-branch 1816 consists of two transistors 1802 and 1804 and one switching transistor 1806. The second multi-branch 1814 consists of one switching transistor 1812 and two transistors 1808 and 1810. The number of transistors used in each multi-branch device is shown for illustration and simplicity of understanding only and not intended to limit the number of transistors that may be used. Thus, a greater number of transistors may be utilized for each multi-branch component. The timing diagram illustrates the operating relationship between the transistors. $V_{GATE}$ 1a is applied to transistor 1802, $V_{GATE}$ 2a is applied to transistors 1804, $V_{GATE}$ 3a is applied to transistor 1806, $V_{GATEb}$ 1b is applied to transistor 1808, $V_{GATE}$ 2b is applied to transistor 1810, and $V_{GATE}$ 3b is applied to transistor 1812.

Figure 19:
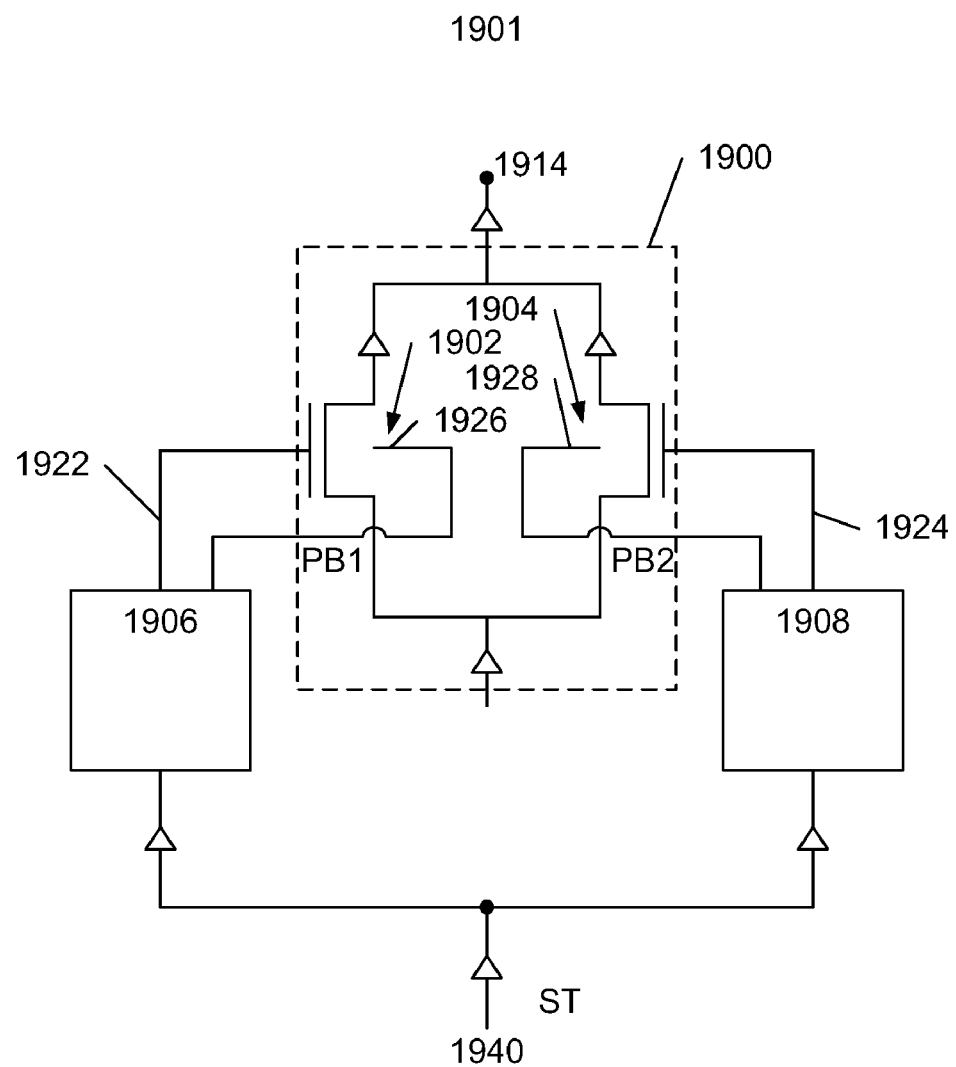
FIG. 19 is a schematic diagram of a switching pair with two control circuits that maintain constant current flow and/or transconductance (gm) through the switching pair when current is transferred back and forth.

FIG. 19 is a schematic representation of a current controlling circuit 1901, which may include a single switching pair 1900 and two control circuits 1906 and 1908. The first control circuit 1906 controls the gate signal at gate terminal 1922 and body signal at body terminal 1926 of the first transistor 1902. The second control circuit 1908 controls the gate signal at gate terminal 1924 and body signal at body terminal 1928 of the second transistor 1904. The control circuits 1906 and 1908 are controlled by a control signal 1940. The current controlling unit 1901 may ensure that total current and/or transconductance (gm) at output terminal 1914 and, thus, going through the device, is constant. In other words, the control units 1906 and 1908 adjust the signals at the gate terminals (1922/1924) and body terminals (1926/1928) such that current or transconductance (gm) at output 1914 is constant.

Figure 20:
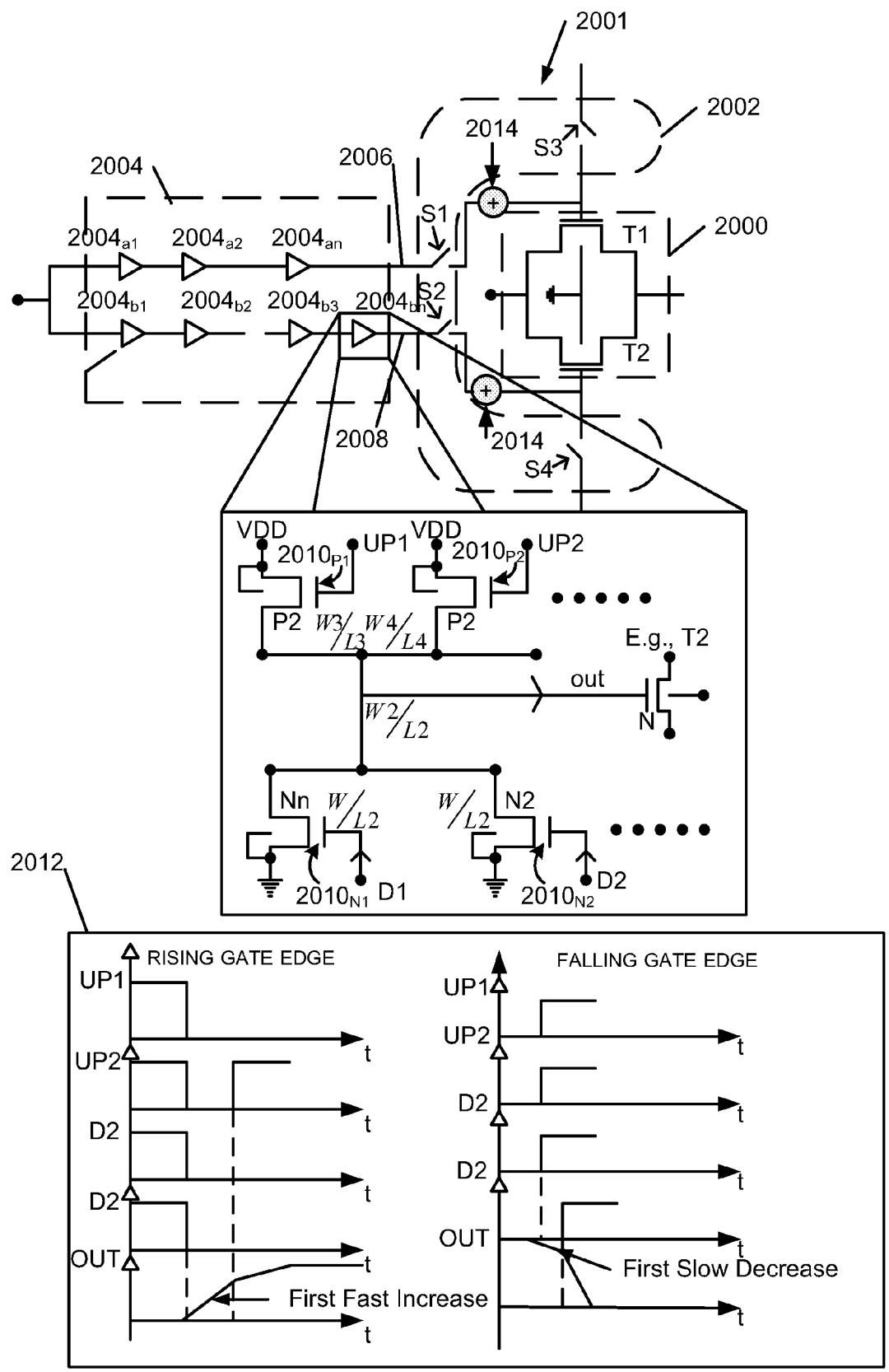
FIG. 20 is a schematic diagram of an implementation of the apparatus of FIG. 15 with the control circuits being shown as inverting amplifiers 2004 that adjust the rising and falling edges of the transistors gate signals in conjunction with an out-of-range supply voltage technique for quenching the transistors. A schematic circuit of one of the amplifiers is shown as well as the timing diagram for operating the amplifiers coupled to the transistors in order to generate a tailored slope to compensate for device non-linear characteristics, particularly during ramp-up and ramp-down.

FIG. 20 is a schematic drawing of a circuit 2001 for adjusting the switching transistor pair 2000 to be used in conjunction with an out-of-supply voltage range switching system 2002 that uses an splitter circuit 2004 arranged with inverting amplifiers, e.g., $2004_{a1-n}$ and $2004_{b1-n}$ (or buffers) to adjust the delay in rising and falling edges of signals along paths 2006 and 2008, respectively. The splitter circuit 2004 may be any suitable arrangement of inverting amplifiers or buffers to adjust the delay of signals, as e.g. D1, D2, UP1, UP2 and in general of the signals along paths 2006 and 2008, containing inverting amplifiers with the features shown in timing diagram 2012. The buffers may operate within the supply voltage range of a given device, may be switched outside of the supply voltage range, and/or may be switched to a voltage of lower than the supply voltage of the switching pair.

One such inverting amplifier $2004_{bn}$, which is the last inverting amplifier in the series and is coupled to the gate of transistor 2006, is shown in a bit more schematic detail. Inverting amplifier $2004_{bn}$ may have any number of PMOS $2010_P$ and NMOS $2010_N$ transistors, though two NMOS and two PMOS transistor branches are shown here to illustrate one example.

The amplifiers 2004 are operated as shown in the timing diagram 2012. The timing diagram 2012 illustrates how a digital signal may be modified by the multiple branches to create a more continuous smoothed signal. For example, according to one implementation, if the initial state of a gate is a high voltage (i.e., "on"), as the gate bias is reduced (i.e. turning the gate "off"), the current is also reduced. This initially may happen relatively slowly. However, it may be desired to maintain a constant current and/or transconductance (gm) through the transistor pair 2000. Thus, inverting amplifiers $2004_{b1-n}$ may be configured and controlled to increase the reduction of voltage as the gate voltage is removed and may reduce the slope of the increase of voltage as the gate voltage is applied. This allows control or tailoring of the rate at which the current increases or decreases for either or both of the transistors in the transistor pair, thus maintaining a constant current and/or transconductance (gm) across the transistor pair 2000.

The tailored control signal compensates for the non-linear characteristics of the device and may be accomplished in a manner consistent with the timing diagram 2012. For example, initially, the NMOS is in "on" state which places the output of the buffer to low voltage (ground). The PMOS is in an "off" state. The NMOS is set to "low" (i.e. high resistive) state and all the PMOS are set to "on." This creates a relatively steep increasing slope in the voltage applied to the body. One PMOS transistor (e.g., $2010_{P2}$) is then turned "off" which reduces the slope of the voltage signal. Then, another PMOS transistor (e.g., $2010_{P3}$) may be turned "off" and so forth, until the desired "on" voltage is reached. A similar process may be followed to tailor the rate at which the voltage returns to an "off" state, as illustrated in timing diagram 2012. Thus, controlling the PMOS and NMOS transistors creates a continuous wave form that compensates for the non-linearities of the transistors.

An additional or alternative signal 2014 may be added to adjust the signal characteristics of the signal provided at the gate. For example, the useful signal (i.e. signal to be processed) may be added when a small signal amplitude is provided to a low noise amplifier, such as shown in FIGS. 17b-d, along the paths including switches S1 and S2 of FIG. 20. In case of an LNA circuit, the inverters at the end of the splitter circuit inverter chain provide the smooth handover between T1 and T2 by switching the gates from an inversion bias condition for optimum amplification (e.g. +0.2V above the threshold voltage of the transistor by using, for example, a VDD that is 0.2V plus the threshold voltage of the NMOS transistor toward 0V and switches S3 and S4 provide after reaching 0V the out of supply voltage signal, e.g. −1V. After inversion condition is reached ($v_{th}$+0.2V) the switches s1 and s2 are opened and the useful small signal (+dc offset=vth+ 0.2V) is provided at the + adding node 2014.

In case T1 and T2 are PMOS transistors, the last inverter circuit can provide the out of supply voltage by itself (e.g. by operating it with a VDD higher than the VDD for T1 and T2). If the last inverter should provide an optimum (T1/T2) PMOS inversion condition for operating T1/T2 in an low noise amplifier the switching should not go to 0V but to a higher voltage that is −0.2V below the threshold voltage (e.g. vth (PMOS)=−0.3V) of the PMOS. In this case, the the NMOS transistors $2010_{N1, N2 ... N}$ of the last inverter are not connected to ground but to a voltage that higher and is appropriate for operating the PMOS in inversion condition for optimum amplification (e.g. vth−0.2V). If this inversion voltage for the PMOS is reached S1 and S2 are opened and the useful signal is provided via the + adding node or in certain cases via the switches s3 and s4. Switches S3 and S4 may not be needed for providing the out of supply voltage range signal because that signal is already provided via the last inverter in the splitter circuit.

Figure 21:
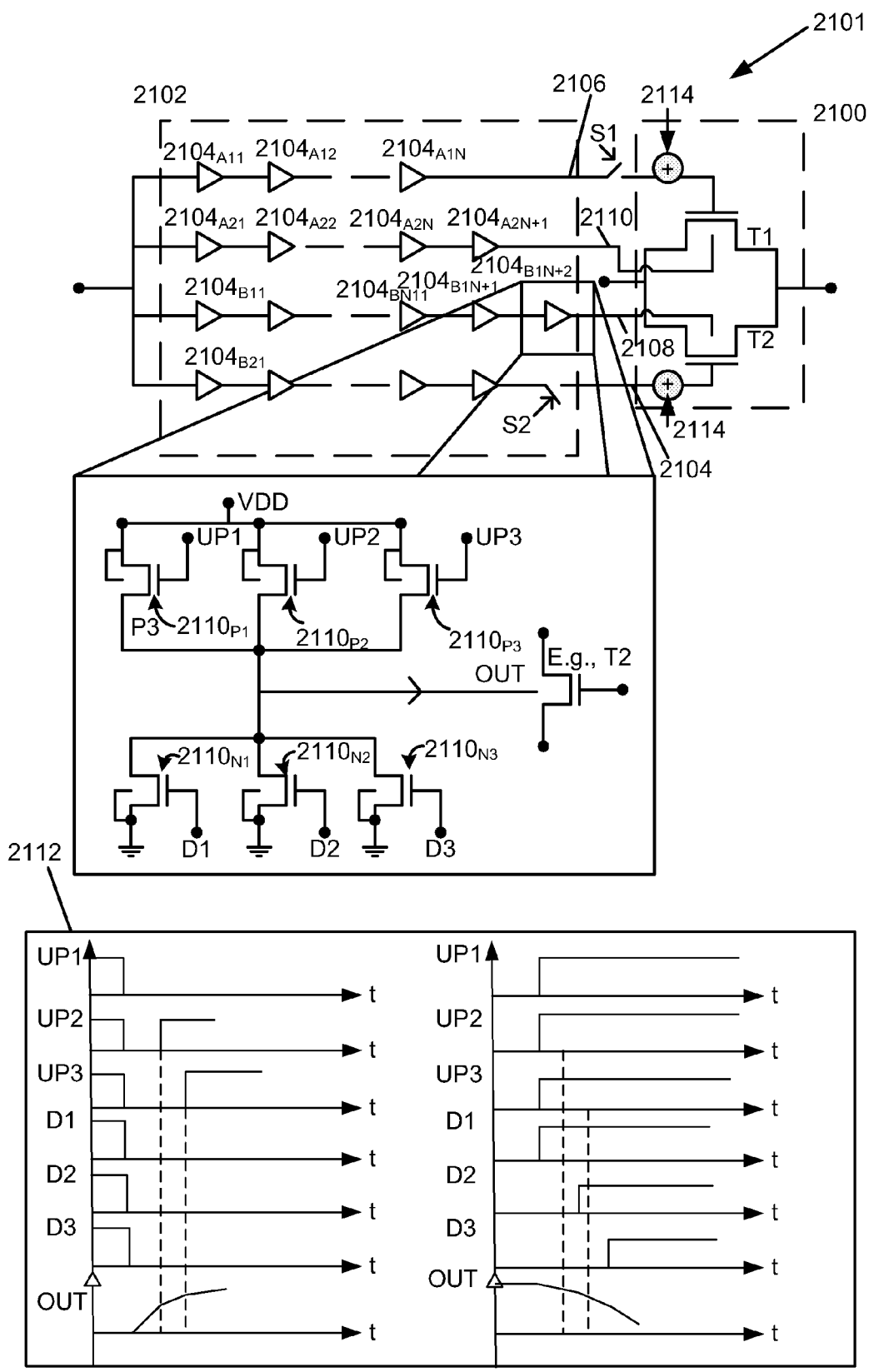
FIG. 21 is a schematic diagram of an implementation of the apparatus of FIG. 15 with the control circuits being shown as inverting amplifiers that adjust the rising and falling edges of the transistors gate signals in the transistors and substrate switching. A schematic circuit of one of the amplifiers is shown as well as the timing diagram for operating the amplifiers coupled to the transistors in order to generate a tailored slope to compensate for device non-linear characteristics, particularly during ramp-up and ramp-down.

FIG. 21 is a schematic drawing of a circuit 2101 composed of a switching pair 2100 and a splitter circuit 2102 used to optimize the timing delay of the rising and falling edges of gate signals along paths 2104 and 2106 in conjunction with body signals 2108 and 2110. This implementation may also use a thicker gate oxide and/or a plurality of transistors that form a multibranch (See FIG. 16) arrangement to enhance the effect of back biasing on reducing flicker noise. Additionally, the inverted amplifiers may optimize the falling and rising edges of the gate and bulk signals in order to maintain constant current and/or transconductance (gm) through the circuit. For example, when the gate voltage is decreased, current decreases in the transistor; this decrease is compensated by increasing the bulk voltage. As the rates of current increase may be different than the rate of decrease, the inverting amplifiers may be configured to generate controlled smoothed signal to maintain a constant current and/or transconductance (gm).

The smoothed signal may be accomplished in a manner consistent with the timing diagram 2112. Initially, the NMOS is in "on" state which places the output of the buffer to low voltage (ground). The PMOS is in an "off" state. The NMOS is set to "low" (i.e. high resistive) state and all the PMOS are set to "on." This creates a relatively steep increasing slope in the voltage applied to the body. One PMOS transistor (e.g., $2110_{P2}$) is then turned "off" which reduces the slope of the voltage signal. Then, another PMOS transistor (e.g., $2110_{P3}$) may be turned "off" and so forth, until the desired "on" voltage is reached. A similar process may be followed to tailor the rate at which the voltage returns to an "off" state, as illustrated in timing diagram 2112.

The inverting amplifiers, or buffers, e.g. $2004_{A1-N}$ drives the capacitance of the transistor to be controlled. This transistor presents a load to the buffer 2102. The number of NMOS and PMOS transistors within the buffer 2102 provides the driver strength (i.e., current) of the buffer 2102. This, combined with the transistor load to be driven, determines how fast the output voltage can be achieved.

Similarly, to obtain a smoothed decrease using the circuit of FIG. 21, initially all of the NMOS and PMOS transistors are set to "low" or "off." All of the PMOS transistors $2110_P$ and, for example, one NMOS transistor (e.g. $2110_{N1}$) are set to "high" or "on." Initially, this creates a relatively slight decreasing slope. Another NMOS transistor (e.g., $2110_{N2}$) is then turned "on," which increases the slope of the voltage signal provided to the body. Additional NMOS transistor (e.g., $2110_{N3}$) may then be turned "on" and so forth, until the desired "off" voltage is reached. Similar inverting amplifiers 2104 may be connect to the gate, as described with regard to FIG. 20. Moreover, the number of amplifiers 2104 may be controlled to introduce or maintain a delay. For example, there may be one more inverting amplifier providing a signal to the body than to the gate. According to this implementation, non-linearities with regard to the transistors in the switching pair 2100 may be compensated such that current and/or transconductance (gm) in the transistor is maintained constant. Moreover, an additional or alternative signal 2114 may be added to adjust the signal characteristics of the signal provided at the gate.

Illustrative Method for Adjusting Signal Parameters

Disclosed herein are improved techniques for reducing power consumption, substrate coupling, and crosstalk induced from semiconductor devices operated under switched gate and/or substrate bias to reduce the low-frequency noise, e.g. flicker noise or 1/f noise and random telegraph noise, in the semiconductor device.

According to one implementation, the reduction of low-frequency noise may require periods of time where the gate to source voltage is at or below the transistors threshold voltage for channel carrier inversion. Such a gate to source voltage is referred as the gate "off" voltage. A gate to source voltage above the threshold voltage establishes a channel carrier inversion condition leading to a higher channel or source to drain current and is referred as the gate "on" voltage. In addition to the gate "off" voltage a forward body bias may be applied that establishes a gate to substrate voltage that drives the device channel into carrier accumulation condition. This body bias is also often referred to as the body bias, substrate bias, back bias, bulk bias "on" voltage, or forward body bias condition.

The achievement of an accumulation condition by gate "off" and substrate "on" signals may be referred to as the noise reduction state, i.e., the state required for reducing the low-frequency noise. The low-frequency noise is reduced during periods in which a gate "off" and substrate "on" voltage are simultaneously arranged. The amount of noise reduction depends on the ratio of the time the device is in accumulation compared to the time the device is in an inversion state as well as the degree of accumulation state that is achieved. The degree the accumulation state is achieved may depend on, for example, the amplitude of the gate "off" and the substrate "on" signals. The amount of noise reduction may also depend on the ratio of the duration the device is in accumulation state compared to the duration the device is in the inversion state. This ratio of duration depends on the timing patterns of the gate "off" and the substrate "on" signals, which are defined by the frequency spectra and phase spectra or by amplitude, period, phase, and duty cycle of gate "off" and substrate "on" signals.

The signal features (e.g. frequency and phase spectra, amplitude, phase, period, duty cycle, etc.) of the gate "off" and substrate "on" signals (or spectra of signals) may be distinguished from the signal features of the actual signal (or spectra of signals) to be processed. The actual signal to be processed is a signal containing useful information such as, for example in a wireless communication device, the voice signal of a human being or any other signal that contains information. However, the signal features of the gate "off" and substrate "on" signals need not be correlated in any manner to the signal features of the signal to be processed. As an illustrative example, the phase noise reduction in a voltage controlled oscillator (VCO) at 100 kHz offset from carrier frequency does not require gate "off" and substrate "on" signals for noise quenching with the same frequency as the oscillation frequency of the VCO which may be, e.g., 14 GHz. In fact, applying the gate "off" and substrate "on" signals with a period of 1 µs maybe sufficient to reduce the noise up to 100 KHz. A lower switching frequency of the gate "off" and substrate "on" signal reduces the switching power $P_{sw}$ according $P_{sw} \sim$(is proportional to) $C*A^2*f$ with "C" being a capacitance (seen from the gate or the substrate), "A" being the amplitude (of gate or substrate signal), and "f" being the frequency of switching. A lower frequency of the switching gate "off" and substrate "on" signal may also reduce substrate coupling, i.e. the effect of coupling the signal to the substrate. The substrate coupling is decreased with a lower frequency because the impedance created from the gate to the substrate and from the bulk well or body well of the transistor towards the substrate increases with lower frequency. Additionally, the use of different spectral characteristics of the switched gate "off" and substrate "on" signal from the spectral characteristics of the signals to be processed in a system on chip solution allows the separation of the respective frequency spectra in the frequency domain. This has the effect of reducing crosstalk between these signals. Moreover, selecting the frequency spectra of the switched gate "off" and substrate "on" signals above the frequency spectra of the signals to be processed allows for more area efficient on-chip filtering techniques to filter the frequency components of the switched gate "off" and substrate "on" signals.

Optimizing the period and duty cycle of the forward body-bias signal and gate "off" signal may allow for lower forward body-bias voltages, which in turn may reduce power consumption. Further, adjusting the period of the forward body-bias signal prevents the need for a constant forward body-bias signal and results in lower power consumption. In short, this allows a forward body-bias signal to be applied selectively based on the preselected duty cycles of the control signal that controls the active device.

Operating a transistor, such as a transistor for use in a wireless communication device, using a forward body-bias signal and gate "off" signal at a frequency that is higher than the frequency of the signal to be processed may prevent signal cross talk through separation of frequency bands and may make it easier to filter out each signal. The forward body-bias frequency may only need to be slightly higher than the frequency of the control signal or the signal to be processed; however, using a much higher frequency, e.g. 10× higher frequency, allows for easier filtering for "on-chip" filters, due to the fact that such filters have smaller area requirements for filtering out signals at higher frequencies.

Figure 22:
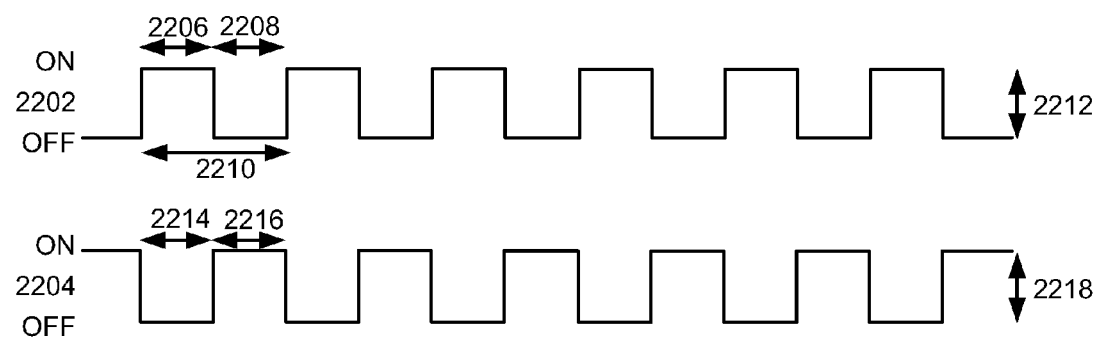
FIG. 22 is an exemplary timing diagram for use in operating the transistor of FIG. 2.

FIG. 22 shows a timing diagram illustrating a basic timing pattern plan to be used with forward body biasing and gate "off" signal. A control signal 2202 may be applied, for example, to gate terminal 224 shown in FIG. 2. The control signal 2202, which may be based upon the actual signal to be processed, has an "on" time 2206, an "off" time 2208, a period 2210, and amplitude 2212. Forward body-bias signal 2204 has an "off" time 2214, an "on" time 2216 and amplitude 2218. The control signal 2202 and forward body-bias signal 2204 are shown 180 degrees out of phase. Thus, when the control signal is "on," the forward body bias signal is "off." This is exemplary only, as the signals may, according to this implementation, both be "off" or "on" for at least a finite period of time.

In digital circuits, a dynamic threshold voltage vth adjustment may be accomplished by applying, during a transistor "off" state, a reverse body bias to make the threshold voltage larger and so reduce leakage current of the circuit. A forward body bias (with source of NMOS connected to ground and source of PMOS connected to VDD) is applied in the transistor "on" state to reduce the threshold voltage and so increase the current. This results in a circuit that has low "off" leakage current and high operating speed. This is in general an in-phase switched gate and body bias, i.e. a phase difference between the gate and the body signal of approximately 0° (e.g., it may be approximately 5° or approximately 10°) or approximately 360° (e.g., it could be approximately 350° or approximately 355°). However, to achieve a body bias noise reduction technique, as described herein, the phase shift between the control (gate) signal and the forward body bias signal may be approximately 180° as shown in FIG. 22. However, the phase shift between the control (gate) signal and the forward body bias signal may be any suitable phase shift, for example, between approximately 91° to approximately 269°, that achieves a noise reduction effect.

Figure 23:
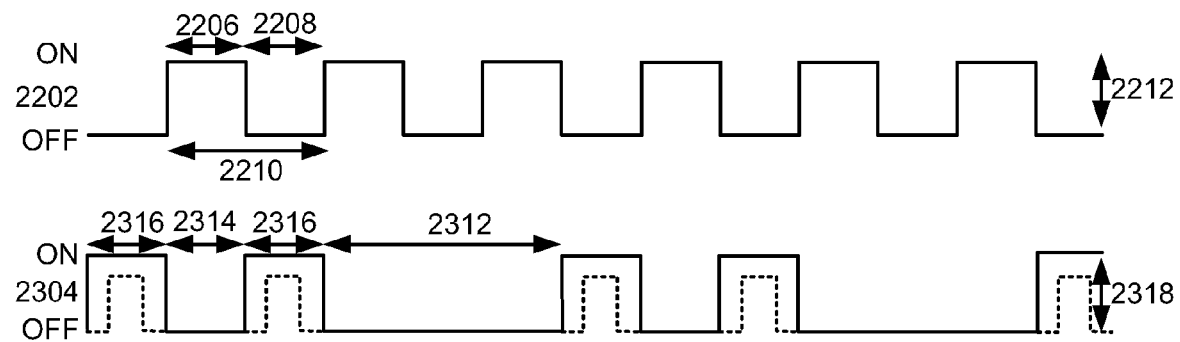
FIG. 23 is an alternative exemplary timing diagram for use in operating the transistor of FIG. 2 in which the duty cycle of the control signal is different from the duty cycle of the forward body-bias signal.

FIG. 23 shows a timing diagram illustrating an alternative timing pattern plan. The control signal 2202 from FIG. 22 is shown for reference. A forward body-biasing signal 2304 having differing characteristics (e.g. duty cycle) from signal 2204 is also shown. More particularly, forward body-biasing signal 2304 has a duty cycle selected to balance power consumption against noise reduction. The duty cycle for the forward body-bias signal 2304 is:

$$\text{Duty Cycle} = \frac{[n*(2316)]}{[(2312) + (2314) + n*(2316)]}$$

where "n" denotes the number of substrate "on" periods. In this example, the "on" periods are equal in length, but this is exemplary only as the "on" periods may be of different lengths of time. The duty cycle equation determines how frequently the forward body-bias signal is applied to the transistor 200. The variables for the duty cycle equation are the forward body-bias signal "on" time 2316, forward body-bias signal "off" time 2314, and the forward body-bias signal "off" period 2312. In this implementation, the forward body-bias signal cycles between "on" and "off" twice per period and the duty cycle for forward body-biasing signal 2304 is different than the duty cycle for control signal 2202. Moreover, signal characteristics such as the amplitude 2318 and the duty cycle of the forward body-biasing signal may be selected to minimize the amount of time needed to empty traps in the transistor.

Figure 24:
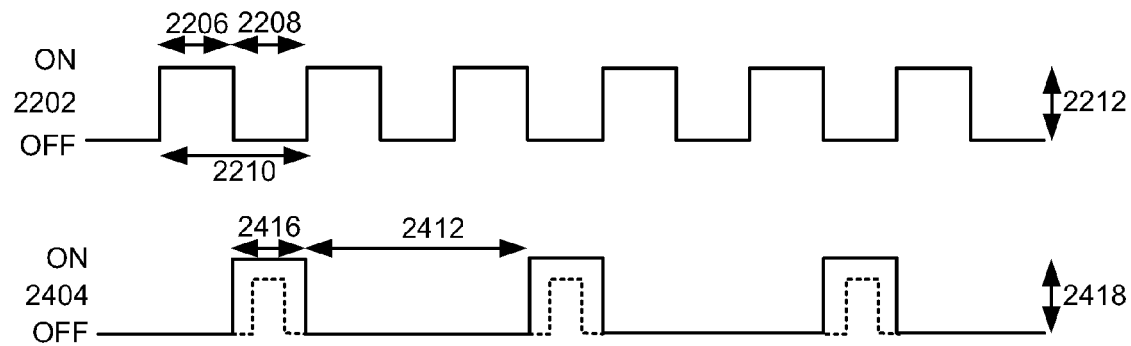
FIG. 24 is an alternative exemplary timing diagram for use in operating the transistor of FIG. 2 in which the duty cycle and period of the control signal is different from the duty cycle and period of the forward body-bias signal.

FIG. 24 illustrates another alternative implementation to be used with forward body biasing in which a forward body-bias signal 2404 is applied to the transistor 200. The forward body biasing signal 2404 has as a characteristic that the period is longer than the period of the control signal 2202 and the signal 2404 is turned "on" and "off" only once per period. Thus, the forward body biasing effect is achieved during certain time periods when the control signal 2202 is turned "off," but may not be achieved at every time period in which the control signal is "off." This may have the effect of providing the advantages of the forward body biasing signal 2404, but conserving power by not applying the forward body biasing signal 2404 for each time the control signal is "off." Moreover, as shown by the dotted lines and according to an alternative implementation, the "on" time and amplitude of the forward body biasing signal may adjusted.

Figure 25:
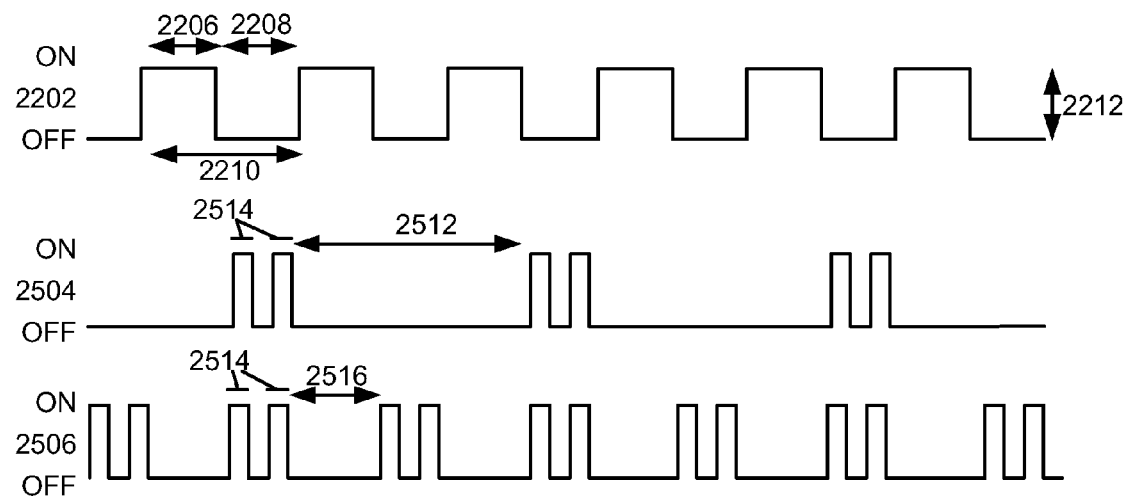
FIG. 25 is an alternative exemplary timing diagram for use in operating the transistor of FIG. 2, showing two alternative implementations in which the duty cycle of the control signal is different from the duty cycle of the forward body-bias signal and the frequency spectra of the forward body-bias signal contains higher frequency components than the frequency spectra of the control signal.

FIG. 25 illustrates two other alternative implementations to be used with forward body biasing in which a forward body-bias signal 2504 or 2506 is applied to the transistor 200. Here the two implementations highlight the use of different periods with a higher frequency forward body-bias signal. The forward body bias signal 2504 has a characteristic period that is longer than the period of the control signal 2202. The forward body bias signal frequency 2504 is much higher than that of the control signal 2202, cycling between "on" and "off" twice during the control signal's 2202 "off" state. However, the forward body bias signal 2504 may have a reduced "on" time 2514 combined with a higher amplitude, which results in lower crosstalk. The second forward body-bias signal 2506 mirrors the frequency of the first signal 2504 but has a shorter period. Note the differences between "off" times 2512 and 2516. The control signal may the same as the useful signal, i.e. the signal to be processed, such as the oscillation signal of a VCO, or the control signal may be a different from the useful signal, such as a noise quenching signal from an LNA.

Figure 26:
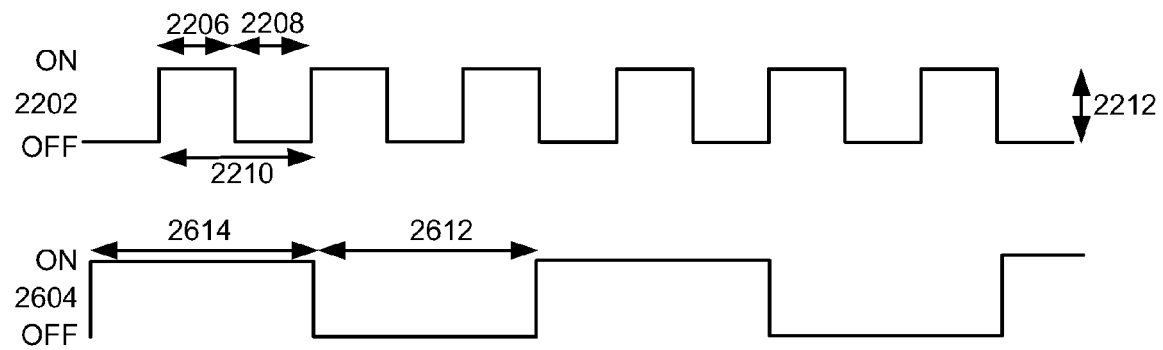
FIG. 26 is an alternative exemplary timing diagram for use in operating the transistor of FIG. 2, showing two alternative implementations in which the duty cycle of the control signal is different from the duty cycle of the forward body-bias signal and the frequency spectra of the forward body-bias signal contains lower frequency components than the frequency spectra of the control signal.

FIG. 26 illustrates another alternative implementation of applying a forward body bias signal to transistor 200. Forward body-bias signal 2604 has a lower frequency than control signal 2202. As a result, forward body-bias signal 2604 is "on" for a portion of the time (2614) that control signal 2202 is "off." Additionally or alternatively, the period may be such that forward body-bias signal 2604 is "off" for a portion of the time (2612) that control signal 2202 is "off." In the example shown, the frequencies and the periods of the control signal 2202 and the forward body-bias signal 2604 are set such that the forward body-bias signal 2604 alternates "on" and "off" for every 1.5 cycles of the control signal's 2202 frequency.

As shown by way of example in FIGS. 22-26, the forward body-bias signal and control signal may be periodic signals with a discrete frequency spectra represented in the figures in the time domain. The forward body-bias signal and control signal may also be non-periodic signals having a continuous frequency and phase spectra in the frequency domain. In a periodic implementation, the fundamental harmonic or fundamental frequency (e.g. a lower boundary) or the lowest frequency in a harmonic series) of the periodic forward body-bias signal may be different from the frequency of the fundamental harmonic of the periodic control signal. For example, the frequency of the fundamental harmonic of the periodic forward body-bias signal may be greater than two (three) times (or 3 times, 4 times, 5 times, 10 times, or n times) the frequency of the fundamental harmonic of the periodic control signal. For the non-periodic signal having a continuous spectra, a lower boundary case may be defined by a certain threshold value of the amplitude of the respective lower boundary frequency. More particularly, the lower boundary may be reached when the amplitude of this frequency component reaches or falls below this threshold value.

As mentioned above, the signal features of the gate "off" and substrate "on" signals need not be correlated in any manner to the signal features of the signal to be processed. For example, the switching frequency may be larger or smaller than the frequency of the signal to be processed. Thus, additionally or alternatively, a center frequency of the frequency and phase spectra of the forward body-bias signal or the control signal may be separated from a center frequency of the frequency and phase spectra of the signal to be processed by the frequency bandwidth (or linewidth) of the body-bias signal, the control signal, or the signal to be processed.

The separation may be based on the bandwidth of one of the signals. For example, if the frequency and phase spectra of the forward body-bias signal has a first bandwidth (or linewidth), the frequency and phase spectra of the control signal has a second bandwidth (or linewidth), and the frequency and phase spectra of the signal to be processed has a third bandwidth (or linewidth), the frequency and phase spectra of the signal to be processed may be separated from the frequency and phase spectra of the forward body-bias signal and/or the frequency and phase spectra of the control signal by the largest of the first, second, and third bandwidth (or linewidth).

The switching signal (body and gate) could be also placed at a useful signal frequency of the system, e.g. one could place the switching frequency at 26 MHz of the crystal oscillator that controls in an PLL the frequency of the RF oscillator oscillating at 14 GHz. The system has any how to cope with the crosstalk due to the 26 MHz signal. Thus, it may be advantageous to put the switching frequency at a frequency of an already present signal in the system. A 26 MHz switching frequency, for example, is sufficient for reducing the phase noise of a 14 GHz oscillator up to an carrier offset of 1 MHz. According to this implementation, the transistors of the 14 GHz oscillator are switched with this 26 MHz (using, e.g. a VCO with its negative conductance tstage using double branches as in FIG. 11 or 13), which is the (useful) signal frequency of the crystal oscillator controlling the frequency of the 14 GHz oscillator via the phase locked loop.

Exemplary Circuit and Apparatus for Out of Supply Voltage Range Biasing

According to one exemplary implementation, a circuit may include a first transistor configured to switch between a first biased condition and a second biased condition and a second transistor configured to switch between a first biased condition and a second biased condition. According to this implementation, at least one of the biased conditions lies out of a supply voltage range. The term "out of supply voltage" as used herein may applies to voltages that may be above or below the operating drain to source or gate to source voltage required for reliable operation of the device. This may result in the out of supply range voltage being more positive or more negative than the operating source or drain voltage. For example, if the operating voltage range is 0V to 3V, any value greater than 3V or less than 0V may constitute an out of supply voltage range signal. Further, for an NMOS transistor, out of supply voltage range may be more negative or lower than the source, drain, and bulk voltages of the transistor, for example, below 0 V. For a PMOS transistor, the out of supply voltage range may be more positive or higher than the source, drain, and bulk voltages of the transistor, for example, above 3V.

The noise of a given transistor may depend at least in part upon the gate-to-source and/or gate-to-substrate off-voltage when the gate signal is switched between an "on" state and an "off" state. Thus, the noise experienced by the PMOS transistor may be reduced when the gate signal is changed to be more positive than the out of supply voltage range as defined above. For example, in a PMOS transistor, the channel region is driven toward stronger accumulation for a more positive gate voltage that is out of the supply voltage range (e.g. for 3 V, then the transistor is driven above 3 V). For a NMOS transistor, the channel region is driven toward stronger accumulation for a more negative gate voltage that is out of the supply voltage range(e.g., <0 V).

According to one implementation, a gate signal is provided in an alternating manner between two bias conditions to reduce flicker noise of a MOS transistor or similar active device. More particularly, in a first condition, a channel-inversion condition, an input signal $V_{IN}$ to be processed is provided. In a second condition, a channel-accumulation condition, a channel accumulation signal $V_A$ is provided to the gate. For an NMOS device, the noise reducing channel accumulation gate signal $V_A$ is a gate bias with a negative gate-to-source, substrate and drain voltage. For a PMOS device, the noise reducing channel-accumulation gate signal $V_A$ is a gate bias signal with a positive gate-to-source, substrate and drain voltage. The noise reducing channel-accumulation gate signal $V_A$ may be provided having a value out of the power supply range, i.e. below $V_{SS}$ (below the source, drain, and bulk voltage of the NMOS transistor) or above $V_{DD}$ (higher than the source, drain, and bulk voltage of the PMOS transistor). Voltages below $V_{SS}$ and above $V_{DD}$ may be generated by charge pump circuits, circuits applying a bootstrap technique or circuits applying a voltage adding technique.

Figure 27:
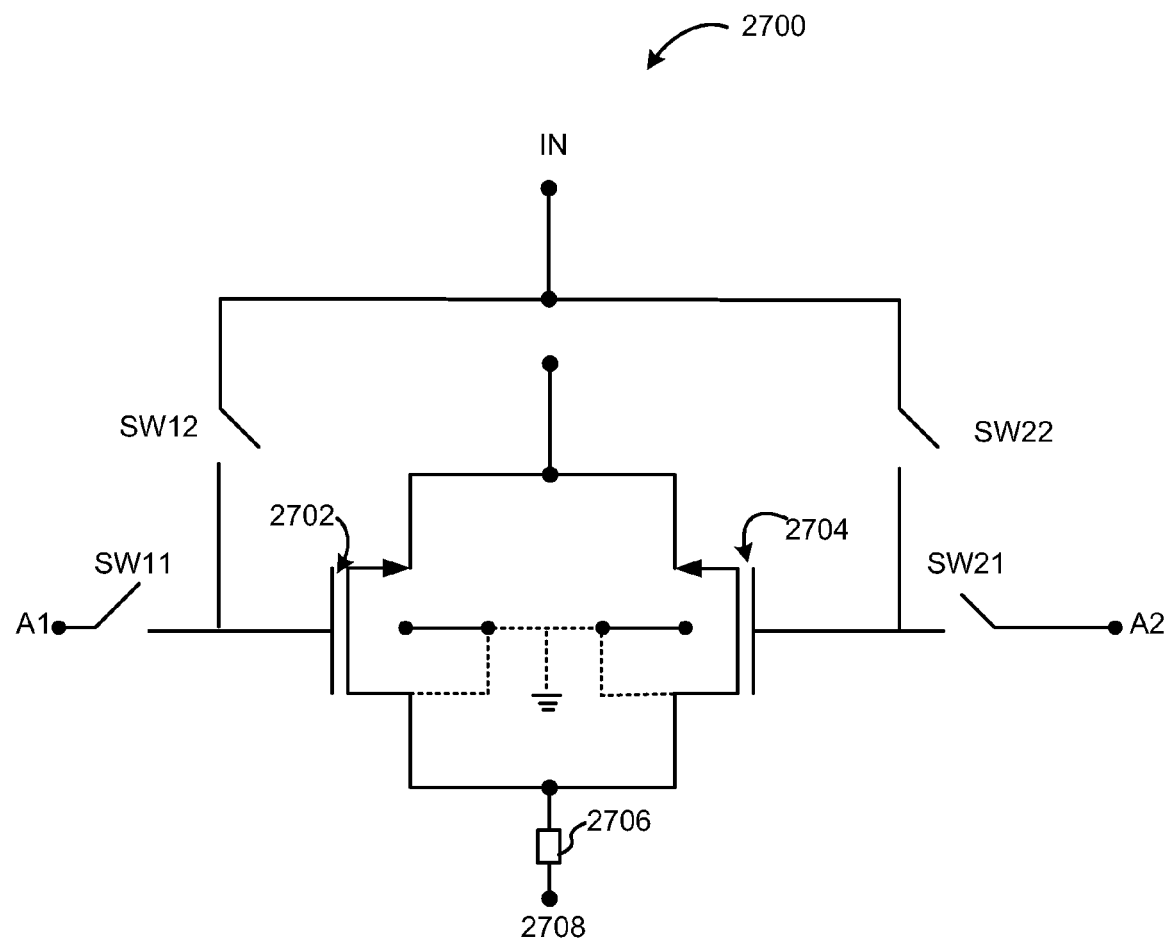
FIG. 27 is a schematic diagram of a noise reduction pair of transistors with switches to for supplying out of supply range voltage signals to the transistors.

FIG. 27 shows a circuit 2700 including a noise reduction pair of transistors (e.g. N1 & N2) with switches SW11, SW12; SW21; SW22 and signal "IN" to be processed. The circuit 2700 is also configured to receive out of supply voltage range, signals $A_1$ and $A_2$. The body terminals of either or both of these transistors in the out of supply voltage range technique may be tied to a constant 0V ground voltage or to the source of the transistors (as shown by dotted lines). An additional body bias (which may be constant or switched) may be provided in additional to the out of supply voltage range switching technique to provide noise quenching. However, if the out of supply voltage is sufficiently high, a forward body bias signal may or may not be applied.

The circuit 2700 may include a first transistor configured to switch between a first biased condition and a second biased condition. The circuit 2700 may also include a second transistor 2704 (currently labeled N2) configured to switch between a first biased condition and a second biased condition, wherein at least one of the biased conditions for each transistor lies out of a supply voltage range.

The first transistor 2702 and second transistor 2704 may be connected in parallel to operate as a switched transistor and may be connected to a load 2706 (inductor, resistor, or other suitable device) and/or ground at terminal 2708. Although a single load 2706 is represented, it is appreciated by one skilled in the art that this representation is shown for simplicity and that a separate load may be coupled to each source terminal of each transistor (2702, 2704) and the loads may be connected at a common node 2708. The first biased condition for the first transistor 2702 may be a channel accumulation condition created by biasing the gate using channel accumulation signal A1, while the second biased condition for the first transistor 2702 may be a channel inversion condition created by applying input signal IN to the first transistor 2702. Channel accumulation signal A1 may, in this example, be a negative value below the supply voltage range, while input signal IN may have a greater value less than or equal to the supply voltage with respect to a NMOS transistor, but above the threshold voltage. The second transistor 2704 may be biased to a channel accumulation condition when the first transistor 2702 is biased to a channel inversion condition. Thus, the first biased condition for the second transistor 2704 may be a channel inversion condition created by applying input signal IN, while the second biased condition for the second transistor 2704 may be a channel accumulation condition created by biasing the gate using channel accumulation signal A2. Channel accumulation signal A2 may, in this example, be also be a positive value above the supply voltage range and may be equal to, or differ from, channel accumulation signal A1. According to this scenario, the gates of the first transistor 2702 and the second transistor 2704 may be alternately biased to a voltage outside of the supply voltage range.

As described above, either or both of the transistors may have a gate dielectric material defined by a thickness and a relative dielectric constant selected such that a flicker noise characteristic of that transistor is reduced below a threshold level when operated under out of supply voltage range switching or switched gate and switched substrate bias conditions (body bias techniques).

Figure 28:
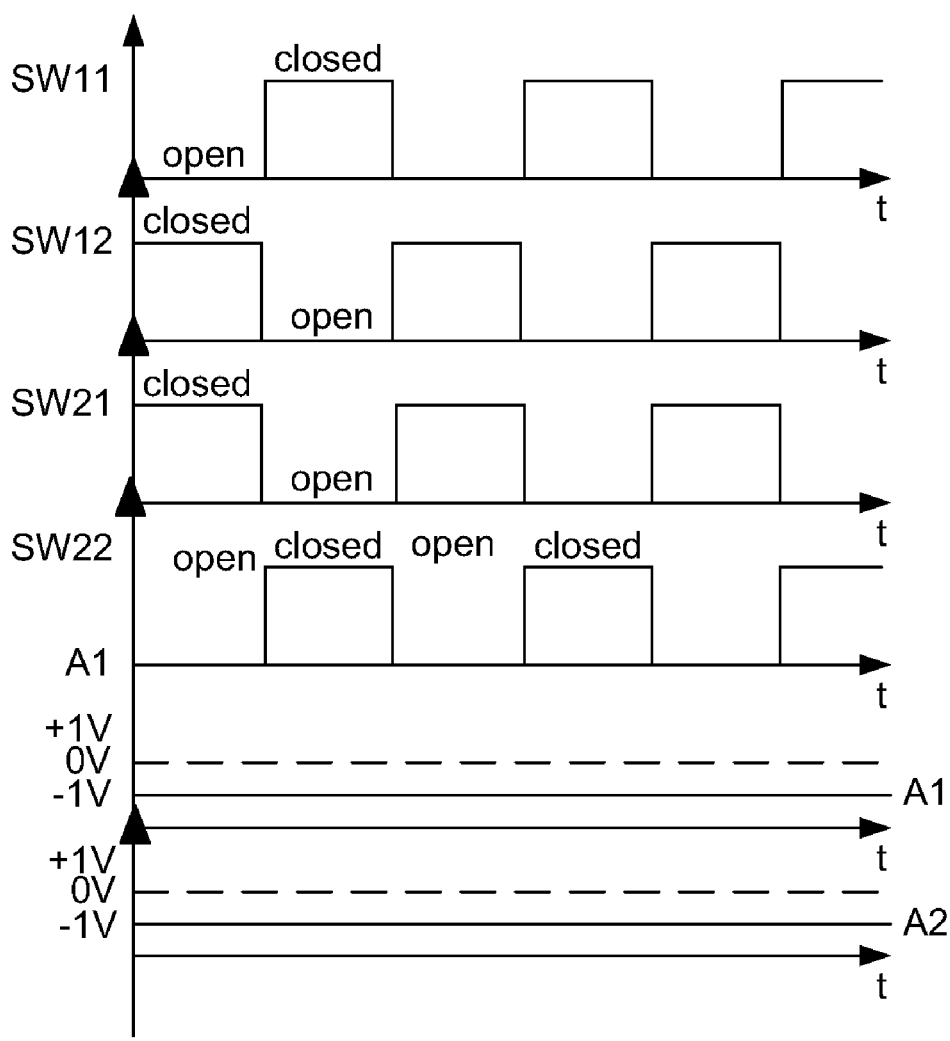
FIG. 28 is a schematic timing diagram for switch states SW11, SW12, SW21, SW22 and noise reducing, out of supply range, signals A1 and A2 (collectively referred to as signals "A").

FIG. 28 shows a schematic timing diagram for the switch states of switches SW11, SW12, SW21, SW22 and out of supply voltage range, signals A1 and A2. Signals A1 and A2 are shown as being at a steady state of "on," with switches SW11, SW12, SW21, and SW22, being toggled to allow the signals to alternately be delivered to the gates of the first transistor 102 and the second transistor 104.

The out of supply voltage biased condition may be created by a control circuit. As described in further detail below, an apparatus may include the circuit shown in FIG. 27 and a control circuit to control the voltage of A1 and/or A2. The control circuit may include any one or more of the following: a charge pump, a voltage generating circuit applying a bootstrap technique, a voltage generating circuit apply a voltage adding technique, or other suitable circuit or device.

Illustrative Method for Out-of-Supply Voltage Range Biasing

Figure 29:
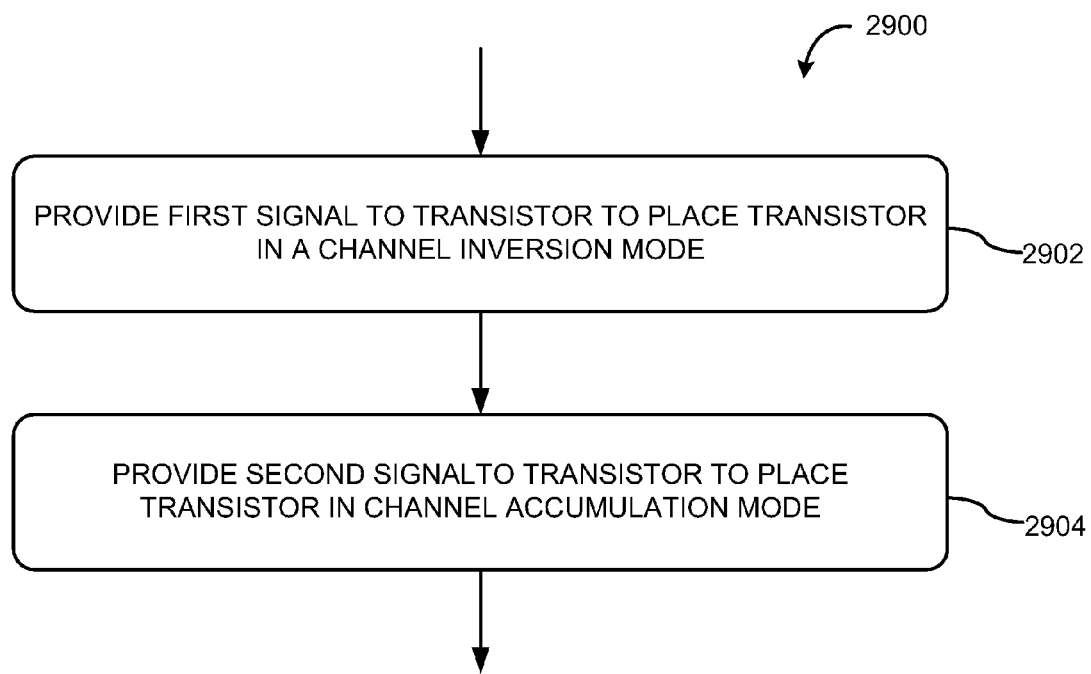
FIG. 29 is a flow diagram for an exemplary process of biasing a transistor.

FIG. 29 illustrates a process 2900 of operating a transistor using at least one biasing signal that has a voltage outside of a supply voltage range.

At 2902, a first signal is provided to the transistor to place the transistor in a channel-inversion mode. Thus, using an NMOS as an example, a channel inversion condition may be created using a signal having a positive value greater than the source voltage or transistor threshold voltage. More particularly, the second signal may be provided as a gate bias with a negative gate to source, substrate and drain voltage or below Vss.

At 2904, a second signal to the transistor to place the transistor in a channel-accumulation mode. The signal may be outside of the supply voltage range. Thus, for the NMOS example, a channel accumulation condition may be created using a signal having a negative value lower than the source, drain, and bulk voltage of the NMOS transistor or lower than Vss. More particularly, the second signal may be provided as a gate bias with a negative gate to source, substrate and drain voltage.

The process may be repeated to alternate between a channel inversion condition and channel accumulation condition.

Exemplary Control Circuits

Figure 30:
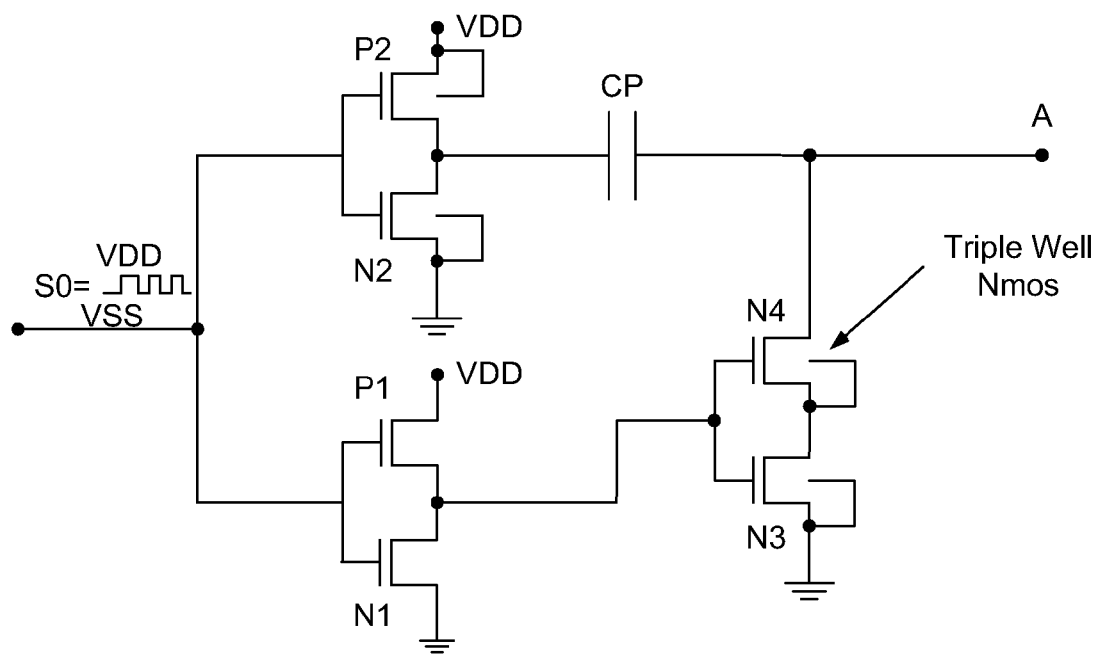
FIG. 30 is a schematic diagram of a charge pump circuit for generating out of supply range voltage signals A.

FIG. 30 shows a charge pump circuit for negative voltages below $V_{SS}$. For example, a limiter comprised of N3 and N4 that limit negative voltage to two pn junction forward bias voltages. N4 may employ a triple well option.

Figure 31:
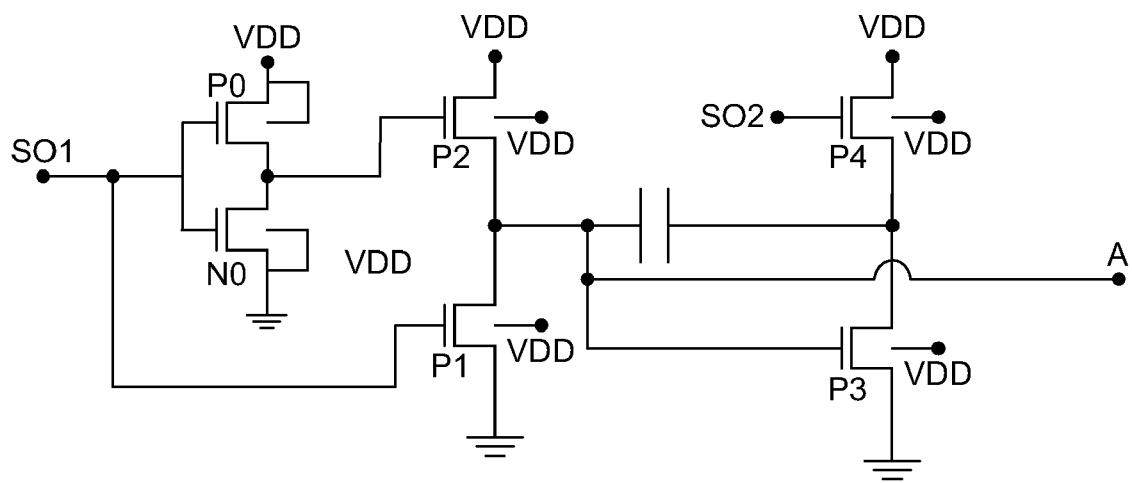
FIG. 31 is a schematic diagram of a circuit using a bootstrap technique for generating out of supply range voltage signals A.

FIG. 31 is a schematic diagram of a circuit using a bootstrap technique for generating out of supply range voltage signals A.

Figure 32:
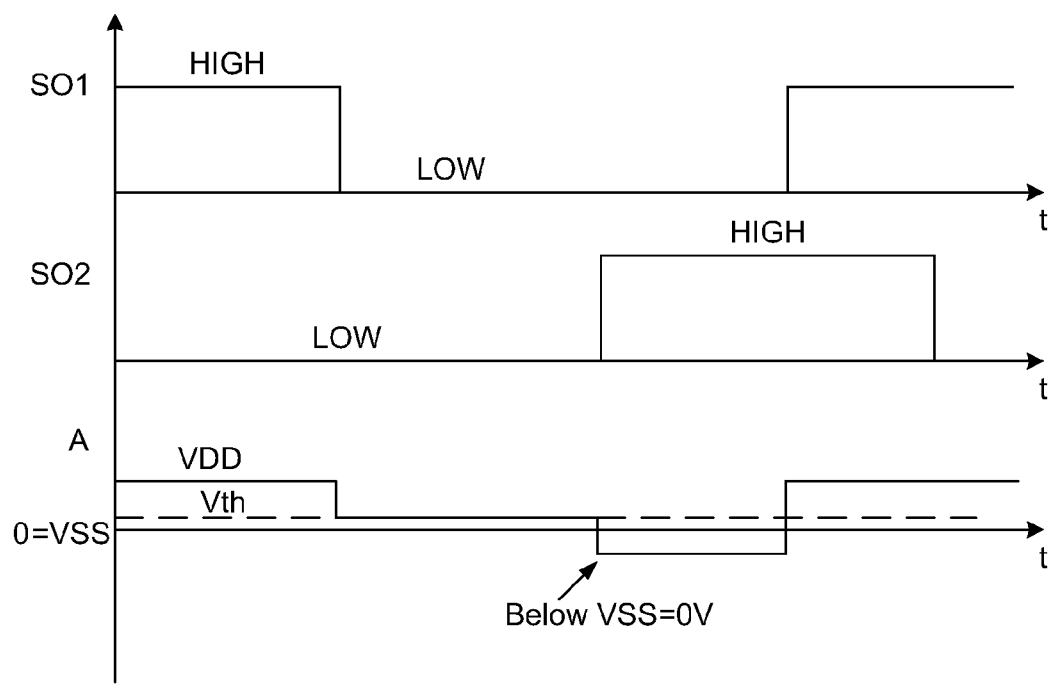
FIG. 32 is a schematic diagram of a timing diagram of signal SO1, SO2, and A that may be utilized with the circuit of FIG. 31.

FIG. 32 is a schematic diagram of a timing diagram of signal SO1, SO2, and A that may be utilized with the circuit of FIG. 30.

Figure 33:
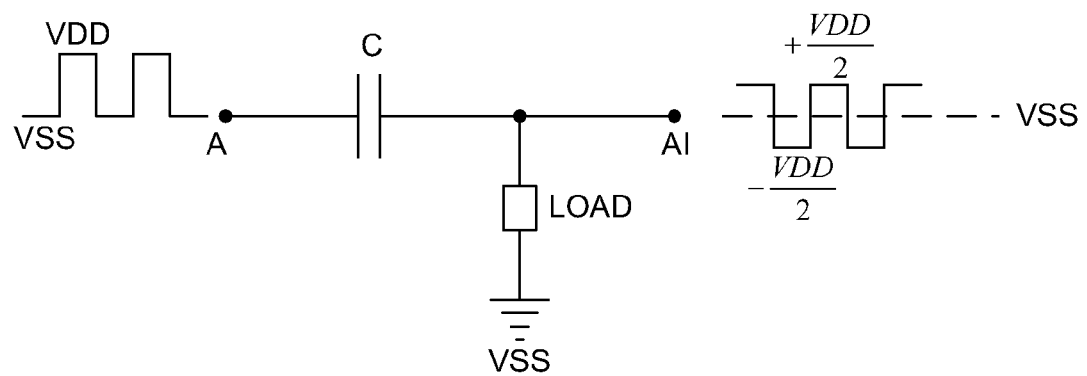
FIG. 33 is a schematic diagram of a circuit using a voltage adding [or level shifting] technique.

FIG. 33 is a schematic diagram of a circuit using a voltage adding (or level shifting) techniques.

Figure 34:
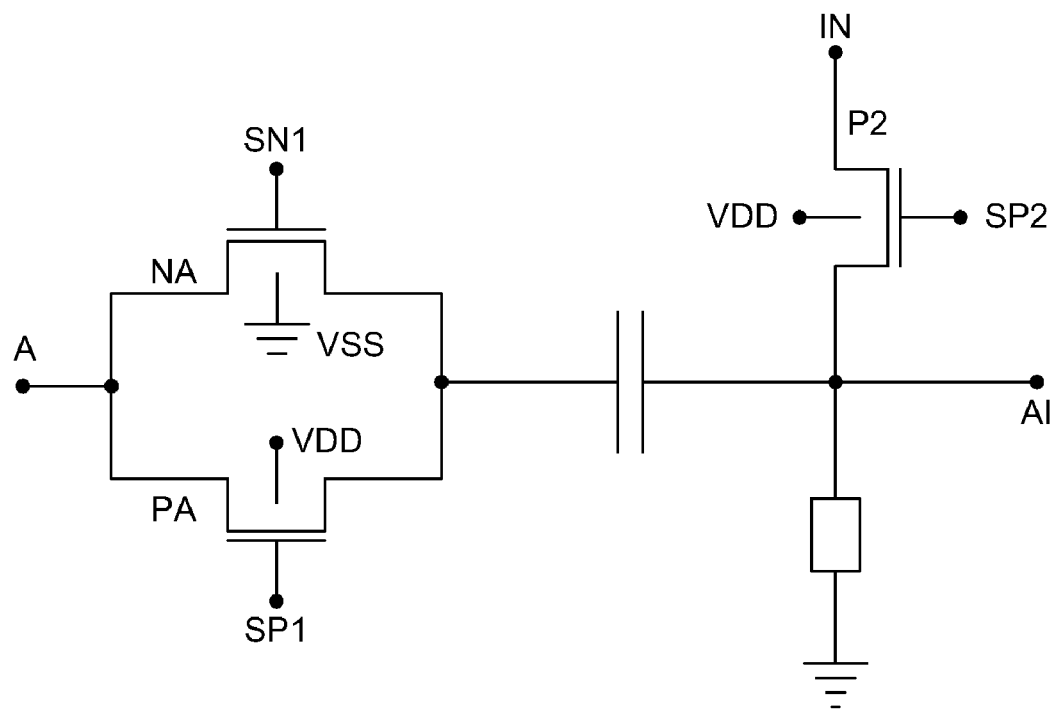
FIG. 34 is a schematic diagram of a circuit using a voltage adding techniques with switches SW11 and SW12 of FIG. 27.

FIG. 34 is a schematic diagram of an apparatus incorporating the circuit 2700, shown in FIG. 27, with the circuit employing voltage adding techniques known in the art to generate signals with voltages out of the supply voltage range.

Figure 35:
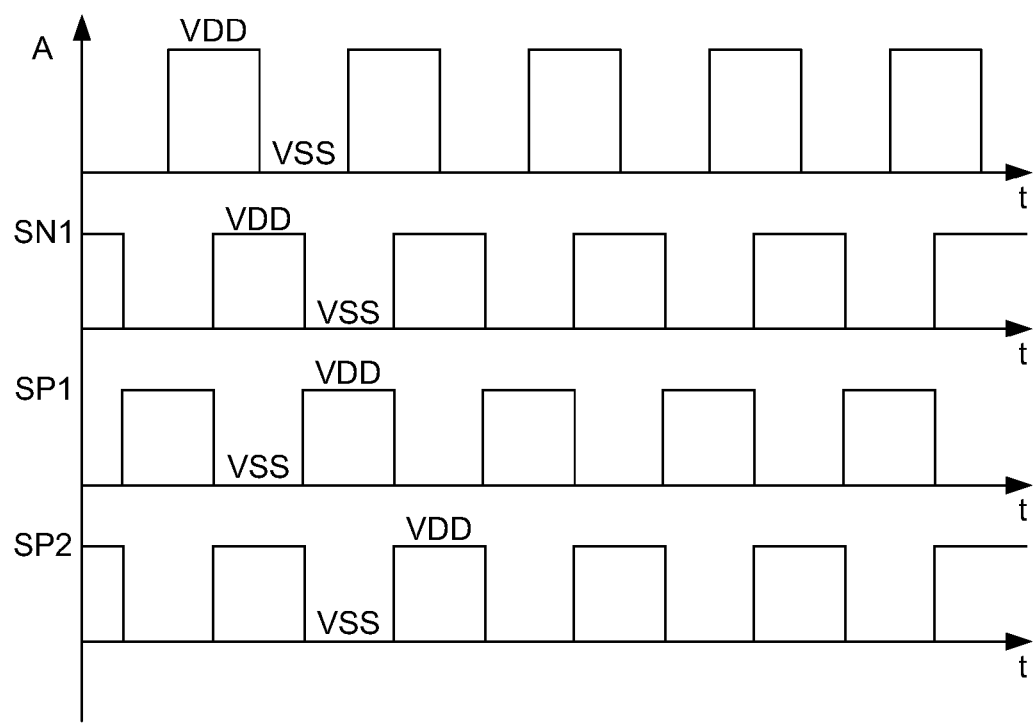
FIG. 35 is a schematic diagram of a timing diagram of signals A, SN1 SP1, SN2 and SP2 in FIG. 34.

FIG. 35 is a schematic diagram of a timing diagram of signals A, SN1 SP1, SN2 and SP2 in FIG. 34.

Figure 36:
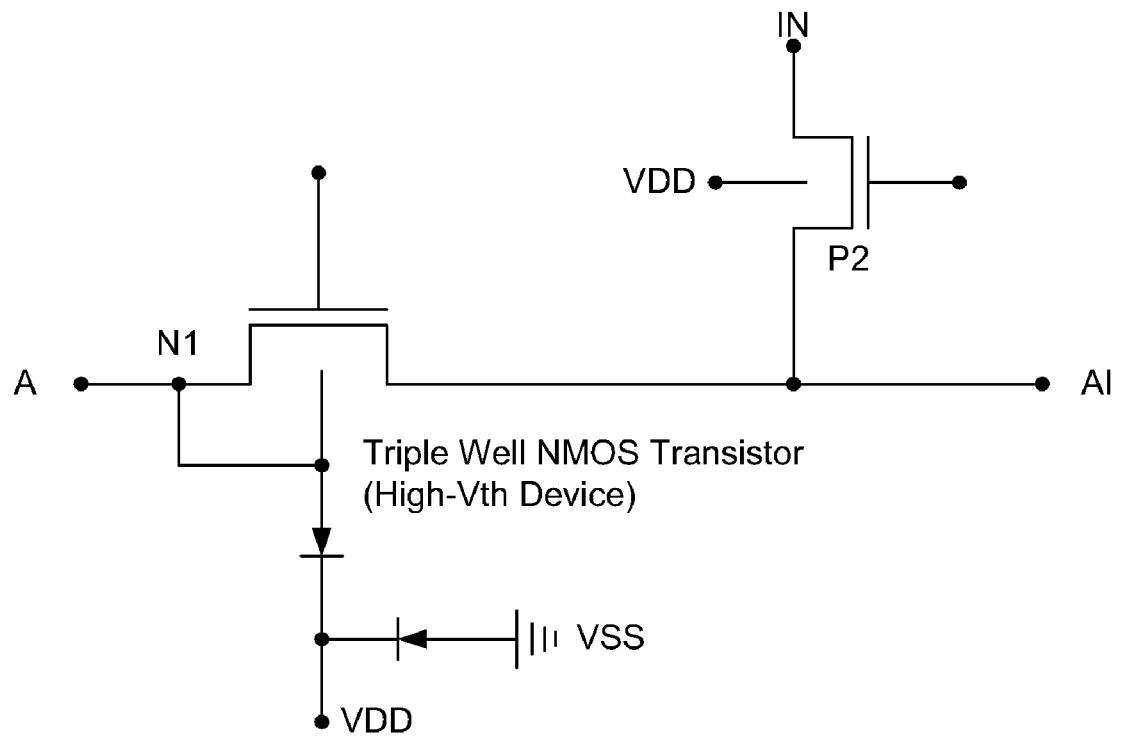
FIG. 36 is a schematic diagram of switches SW11, SW12 (or SW21, SW22) of FIG. 27.

FIG. 36 shows switches, such as MOSFET transistors, are used to provide alternating the signal and the noise reducing channel-accumulation signal A. Transistors N1 and P1 may represent switches SW11 and SW12 (or SW21, SW22) shown in FIG. 27. A triple well NMOS transistor, which may additionally have a higher threshold voltage vth may be utilized to enable the transferring of negative voltages and the blocking of positive voltages from signal node A to signal node AI.

The out of range switching method and configuration can be applied to devices utilizing so called triple-well technology as well as to devices having no triple well but only twin wells, which may be more common for technology nodes greater than 90 nm. Furthermore, it may be possible to arrange the disclosed apparatus (see e.g. FIG. 34) such that few if any signals cause possible substrate coupling and such that spurs are directly injected into the substrate through the large area backbias/substrate diode as described above.

The basic circuits and apparatuses described above may be applied to RF/analog circuits and may reduce flicker noise performance degradation. The circuits and apparatuses described above may be used with NMOS pairs or PMOS pairs.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described herein and variations of these specific features and acts may be implemented separated or may be combined.

The invention claimed is:

1. An apparatus in a semiconductor body comprising:
a first transistor component having at least one gate terminal configured to receive an "on" gate signal to increase current flow through the first transistor component or an "off" gate signal to decrease the current flow through the first transistor component; and
a second transistor component having at least one gate terminal configured to receive an "on" gate signal to increase current flow through the second transistor component or an "off" gate signal to decrease the current flow through the second transistor component,
wherein the first transistor component and the second transistor component are connected in parallel to form a switching pair device,
wherein the transistor components are configured to operate together to equalize the current change per time through the switching pair device such that the total current through, or the transconductance of, the switching pair device approaches a constant value when the first and second transistor components are alternated between receiving the "on" and "off" gate signals,
wherein the first transistor component and the second transistor component each have a gate length attribute and a gate width attribute and at least one of the first or second transistor components includes a plurality of transistors connected in parallel, each transistor of the plurality of transistors having a gate width attribute and a gate, source, drain, and bulk terminal, and
wherein at least one of the plurality of transistors connected in parallel is "off" when another of the plurality of transistors connected in parallel is "on" and at least one of the plurality of transistors connected in parallel is "on" when another of the plurality of transistors connected in parallel is "off".

2. An apparatus according to claim 1, wherein the gate width attributes of the first transistor component and the second transistor component are equal, the gate length attributes for the first transistor component and the second transistor component are equal, the plurality of transistors each have equal gate width attributes, the sum of gate width attributes for each of the plurality of transistors equals the first transistor component gate width attribute.

3. An apparatus according to claim 1, wherein the first and second transistor components are configured to receive a forward body-bias signal.

4. An apparatus according to claim 1, further comprising:
a control circuit that controls the rising and falling amplitudes of each of the gate signals received by the first and second components and controls a bulk signal during switching such that the total current going through, or the transconductance of, the switching pair device approaches a constant value.

5. An apparatus according to claim 4, wherein the control circuit is configured such that as the gate of the first transistor component receives the "off" gate signal, the first transistor component receives an "on" forward body-bias signal and as the gate of the first transistor component receives the "on" gate signal, the first transistor component receives an "off" forward body-bias signal.

6. An apparatus according to claim 4, wherein the rising amplitude of the gate signal has a ramp rate that decreases as the gate signal approaches a preselected "on" gate signal value.

7. An apparatus according to claim 4, wherein the falling amplitude of the gate signal has a ramp rate that increases as the gate signal approaches a preselected "off" gate signal value.

8. An apparatus according to claim 4, wherein the control circuit comprises a plurality of inverting amplifiers that are configured to provide different driver strengths for the rising and falling amplitudes.

9. An apparatus according to claim 8, wherein the plurality of inverting amplifiers controls the gate and bulk signals to maintain constant current through or transconductance established by the first and second transistor components when the gate signal is switching from "on" to "off" and the bulk signal is switching from "off" to "on" or when the gate signal is switching from "off" to "on" and the bulk signal is switching from "on" to "off".

10. An apparatus in a semiconductor body comprising:
a first transistor component having at least one gate terminal configured to receive an "on" signal to increase current flow through the first transistor component or an "off" signal to decrease the current flow through the first transistor component; and
a second transistor component having at least one gate terminal configured to receive an "on" signal to increase current flow through the second transistor component or an "off" signal to decrease the current flow through the second transistor component,
wherein the first transistor component and the second transistor component are connected in parallel to form a switching pair device, the first and second transistor components configured to operate together to equalize a current change per time through the switching pair device such that a total current through the switching pair device approaches a constant value when the gate terminals of the first and second transistor components are alternated between receiving the "on" and "off" signals, at least one of the first transistor component and the second transistor component comprising a plurality of transistors connected in parallel, wherein at least one of the plurality of transistors connected in parallel is "off" if another of the plurality of transistors connected in parallel is "on" and at least one of the plurality of transistors connected in parallel is "on" if another of the plurality of transistors connected in parallel is "off," and
wherein at least one of the first and second transistor components is configured to receive a forward body-bias signal.

11. A method for operating a switching pair device comprising:
alternately applying "on" and "off" control signals to a gate terminal of a first transistor component;
alternately applying "on" and "off" control signals to a gate terminal of a second transistor component, the "on" signal applied to the second transistor component such that the first and second transistor components do not receive an "on" signal simultaneously;
equalizing a current change per time through the switching pair device such that a total current through the switching pair device approaches a constant value when alternately applying the "on" and "off" control signals to the gate terminals of the first and second transistor components, wherein at least one of the first transistor component and the second transistor component comprises a plurality of transistors connected in parallel and at least one of the plurality of transistors connected in parallel is "off" if another of the plurality of transistors connected in parallel is "on" and at least one of the plurality of transistors connected in parallel is "on" if another of the plurality of transistors connected in parallel is "off"; and applying a forward body bias to at least one of the first and second transistor components.

12. A method for operating a multi-branch switching pair device comprising:

alternately applying "on" and "off" signals to each of a plurality of transistors of a first transistor component, the plurality of transistors coupled in parallel, at least one of the plurality of transistors of the first transistor component being "on" when another of the plurality of transistors of the first transistor component is "off" and at least one of the plurality of transistors of the first transistor component being "off" when another of the plurality of transistors of the first transistor component is "on;"

alternately applying "on" and "off" signals to each of a plurality of transistors of a second transistor component, the plurality of transistors coupled in parallel, at least one of the plurality of transistors of the second transistor component being "on" when another of the plurality of transistors of the second transistor component is "off" and at least one of the plurality of transistors of the second transistor component being "off" when another of the plurality of transistors of the second transistor component is "on;"

equalizing a current change per time through the multi-branch switching pair device such that a total current through the multi-branch switching pair device approaches a constant value when alternately applying the "on" and "off" signals to the plurality of transistors of the first and second transistor components;

applying a forward body bias to at least one of the transistors in the first or second transistor components.

13. A method according to claim 12, further comprising:

determining which transistor of the at least one of the plurality of transistors of the first transistor component will receive an "on" signal when another transistor of the plurality of transistors of the first transistor component receives an "off" signal.

14. A method according to claim 13, wherein the determination is based upon a mismatch characteristic between the at least one of the plurality of transistors of the first transistor component and another transistor of the plurality of transistors of the first transistor component.

15. A method according to claim 13, wherein a first transistor of two most nearby matched transistors of the plurality of transistors of the first transistor component will receive an "on" control signal while a second transistor of the two most nearby matched transistors of the plurality of transistors of the first transistor component receives an "off" control signal.

16. A method according to claim 13, wherein the determination is based upon a sequential predefined order of the physical layout of the plurality of transistors of the first transistor component.

17. A method according to claim 13, wherein the determination is based on a random selection or pseudo random selection.

* * * * *